United States Patent
Yamazaki et al.

(10) Patent No.: US 8,686,425 B2
(45) Date of Patent: Apr. 1, 2014

(54) METHOD FOR MANUFACTURING SEMICONDUCTOR DEVICE

(75) Inventors: Shunpei Yamazaki, Setagaya (JP); Takuya Hirohashi, Atsugi (JP); Masahiro Takahashi, Atsugi (JP); Takashi Shimazu, Machida (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/584,840

(22) Filed: Aug. 14, 2012

(65) Prior Publication Data

US 2012/0305913 A1 Dec. 6, 2012

Related U.S. Application Data

(63) Continuation of application No. 12/976,388, filed on Dec. 22, 2010, now Pat. No. 8,530,285.

(30) Foreign Application Priority Data

Dec. 28, 2009 (JP) .................................. 2009-296825

(51) Int. Cl.
*H01L 31/112* (2006.01)
*H01L 21/00* (2006.01)

(52) U.S. Cl.
USPC .............. 257/69; 257/213; 438/150; 438/187

(58) Field of Classification Search
USPC ......... 438/149, 150, 154, 187, 198, 285, 308, 438/104; 257/57, 69, 213, E29.296, 257/E29.273, E21.09, E29.068
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1 737 044 A | 12/2006 |
| EP | 2 226 847 A | 9/2010 |

(Continued)

OTHER PUBLICATIONS

Fortunato et al., "Wide-Bandgap High-Mobility Zno Thin-Film Transistors Produced at Room Temperature," Appl. Phys. Lett. (Applied Physics Letters), Sep. 27, 2004, vol. 85, No. 13, pp. 2541-2543.

(Continued)

*Primary Examiner* — Hsien Ming Lee
(74) *Attorney, Agent, or Firm* — Eric J. Robinson; Robinson Intellectual Property Law Office, P.C.

(57) ABSTRACT

A larger substrate can be used, and a transistor having a desirably high field-effect mobility can be manufactured through formation of an oxide semiconductor layer having a high degree of crystallinity, whereby a large-sized display device, a high-performance semiconductor device, or the like can be put into practical use. A first multi-component oxide semiconductor layer is formed over a substrate and a single-component oxide semiconductor layer is formed thereover; then, crystal growth is carried out from a surface to an inside by performing heat treatment at 500° C. to 1000° C. inclusive, preferably 550° C. to 750° C. inclusive so that a first multi-component oxide semiconductor layer including single crystal regions and a single-component oxide semiconductor layer including single crystal regions are formed; and a second multi-component oxide semiconductor layer including single crystal regions is stacked over the single-component oxide semiconductor layer including single crystal regions.

40 Claims, 24 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,960,727 B2 * | 6/2011 | Nakahara et al. .............. 257/43 |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0038641 A1 | 2/2010 | Imai |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0127523 A1 | 6/2011 | Yamazaki |
| 2011/0147739 A1 | 6/2011 | Yamazaki et al. |
| 2011/0193083 A1 | 8/2011 | Kim et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 A | 10/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2007-096055 | 4/2007 |
| JP | 2007-123861 | 5/2007 |
| JP | 2009-231613 | 10/2009 |
| JP | 2010-016347 | 1/2010 |
| JP | 4415062 | 2/2010 |
| JP | 2010-067954 | 3/2010 |
| JP | 2010-177431 | 8/2010 |
| JP | 2010-177431 A | 8/2010 |
| JP | 4571221 | 10/2010 |
| JP | 2012-160679 A | 8/2012 |
| WO | WO 2004/114391 | 12/2004 |
| WO | WO-2005/088726 | 9/2005 |
| WO | WO2008/133345 | 11/2008 |

(56) References Cited

FOREIGN PATENT DOCUMENTS

| WO | WO-2009/034953 | 3/2009 |
|---|---|---|
| WO | WO 2009/034953 | 3/2009 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350°C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)m$ ($M$=In,Ga; $m$=Integer) Described by Four-Dimensional Superspace Group," Journal of Solid State Chemistry, 1998, vol. 139, 347-355.

Son et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 983-985.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTs," IDW '09: Proceedings of the $16^{th}$ International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by Peald Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-GaZn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 in. QVGA AMOLED Display Using In-Ga-Zn-Oxide TFTs with a Novel Passivation Layer," SID Digest '09: SID International Symposium Digest of Technical Papers, May 31, 2009, pp. 284-287.

(56) References Cited

OTHER PUBLICATIONS

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer- Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000°C," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the $6^{th}$ International Display Workshops, Dec. 3, 2008, pp. 581-584.

Kim et al., "High-Performance oxide thin film transistors passivated by various gas plasmas," $214^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

International Search Report (Application No. PCT/JP2010/072313) dated Jan. 18, 2011.

Written Opinion (Application No. PCT/JP2010/072313) dated Jan. 18, 2011.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

Nomura.K et al., "Growth mechanism for single-crystalline thin film of InGaO3(ZnO)5 by reactive solid-phase epitaxy.", J. Appl. Phys. (Journal of Applied Physics) , May 15, 2004, vol. 95, No. 10, pp. 5532-5539.

"International Search Report (Application No. PCT/JP2010/072304; PCT13039) Dated Jan. 18, 2011,".

"Written Opinion (Application No. PCT/JP2010/072304; PCT13039) Dated Jan. 18, 2011,".

* cited by examiner

Zn: ○   O: ●

● In, Ga, Zn
○ O

METHOD FOR MANUFACTURING SEMICONDUCTOR DEVICE

TECHNICAL FIELD

The present invention relates to a semiconductor device which includes a circuit including at least a semiconductor element such as a transistor as an element, and a manufacturing method thereof. For example, the present invention relates to an electronic device which includes, as a component, any of a power device mounted in a power circuit, a semiconductor integrated circuit including a memory, a thyristor, a converter, an image sensor, or the like, an electro-optical device typified by a liquid crystal display panel, and a light-emitting display device including a light-emitting element.

In this specification, a semiconductor device generally means a device which can function by utilizing semiconductor characteristics, and an electro-optical device, a semiconductor circuit, and an electronic device are all semiconductor devices.

BACKGROUND ART

A transistor formed over a glass substrate or the like is manufactured using amorphous silicon, polycrystalline silicon, or the like, as typically seen in a liquid crystal display device. Although a transistor manufactured using amorphous silicon has low field-effect mobility, it has an advantage of being able to be formed over a larger glass substrate. On the other hand, although a transistor manufactured using polycrystalline silicon has high field-effect mobility, it has a disadvantage of not being suitable for a larger glass substrate.

In contrast to a transistor manufactured using silicon, a technique in which a transistor is manufactured using an oxide semiconductor and applied to an electronic device or an optical device has attracted attention. For example, Patent Document 1 and Patent Document 2 disclose a technique in which a transistor is manufactured using zinc oxide or an In—Ga—Zn—O-based oxide as an oxide semiconductor and such a transistor is used as a switching element or the like of a pixel of a display device.

REFERENCE

Patent Document

[Patent Document 1] Japanese Published Patent Application No. 2007-123861
[Patent Document 2] Japanese Published Patent Application No. 2007-096055

DISCLOSURE OF INVENTION

Further, large-sized display devices have increasingly become popular. Home-use televisions with a display screen diagonal of 40 inches to 50 inches have started to spread.

The field-effect mobility of a transistor manufactured using a conventional oxide semiconductor is 10 cm$^2$/Vs to 20 cm$^2$/Vs. Since the field-effect mobility of a transistor manufactured using an oxide semiconductor is ten times or more as high as that of a transistor manufactured using amorphous silicon, the transistor manufactured using an oxide semiconductor can provide a performance sufficient as a pixel switching element even in a large-sized display device.

However, there has been a limitation on the transistor manufactured using an oxide semiconductor when being used as a switching element in a driving device of a semiconductor device, for example, in a driver circuit of a large-sized display device or the like.

It is an object of an embodiment of the present invention to enable the use of a larger substrate and the manufacture of a transistor having a desirably high field-effect mobility through formation of an oxide semiconductor layer having a high degree of crystallinity, and also to put a large-sized display device, a high-performance semiconductor device, or the like into practical use.

According to an embodiment of the present invention, a first multi-component oxide semiconductor layer is formed over a substrate and a single-component oxide semiconductor layer is formed over the first multi-component oxide semiconductor layer; then, crystal growth is carried out from a surface to an inside by performing heat treatment at 500° C. to 1000° C. inclusive, preferably 550° C. to 750° C. inclusive, so that a first multi-component oxide semiconductor layer including single crystal regions and a single-component oxide semiconductor layer including single crystal regions are formed; and a second multi-component oxide semiconductor layer including single crystal regions is stacked over the single-component oxide semiconductor layer including single crystal regions. Note that single crystal regions of each of the first multi-component oxide semiconductor layer including single crystal regions, the single-component oxide semiconductor layer including single crystal regions, and the second multi-component oxide semiconductor layer including single crystal regions are flat-plate-shaped single crystal regions having uniform crystal direction with respect to the surface thereof. The flat-plate-shaped single crystal regions have the a-b plane parallel to the surface thereof and the c-axis in a direction perpendicular to the surfaces of the first multi-component oxide semiconductor layer including single crystal regions, the single-component oxide semiconductor layer including single crystal regions, and the second multi-component oxide semiconductor layer including single crystal regions. The c-axis directions of the first multi-component oxide semiconductor layer including single crystal regions, the single-component oxide semiconductor layer including single crystal regions, and the second multi-component oxide semiconductor layer including single crystal regions correspond to the depth direction.

The single-component oxide semiconductor layer including single crystal regions is formed in the following manner: the single-component oxide semiconductor layer is formed over the first multi-component oxide semiconductor layer, and then, heat treatment at 500° C. to 1000° C. inclusive, preferably 550° C. to 750° C. inclusive is performed so that crystal growth is carried out from the surface to the inside. The single crystal regions which are formed at the surface of the single-component oxide semiconductor layer including single crystal regions and in which crystals are aligned in the same crystal direction are formed in such a manner that crystal growth is carried out from the surface in a depth direction; accordingly, the single crystal regions can be formed without being influenced by a base component of the single-component oxide semiconductor layer. In addition, crystal growth of the first multi-component oxide semiconductor layer is carried out by epitaxial growth or axial growth from the surface of the first multi-component oxide semiconductor layer with the use of the single-component oxide semiconductor layer including single crystal regions as a seed crystal, so that the single crystal regions can be formed without being influenced by a base component of the first multi-component oxide semiconductor layer.

The second multi-component oxide semiconductor layer including single crystal regions can be formed in the following manner: the second multi-component oxide semiconductor layer is formed over the single-component oxide semiconductor layer including single crystal regions, and then, heat treatment at 100° C. to 500° C. inclusive, preferably 150° C. to 400° C. inclusive is performed, so that crystal growth is carried out toward the surface of the second multi-component oxide semiconductor layer which is in an upper level than the surface of the single-component oxide semiconductor layer including single crystal regions. That is, the single-component oxide semiconductor layer including single crystal regions is a seed crystal for the second multi-component oxide semiconductor layer.

In addition, the second multi-component oxide semiconductor layer including single crystal regions can be formed in the following manner: the second multi-component oxide semiconductor layer is deposited over the single-component oxide semiconductor layer including single crystal regions typically by a sputtering method while heating is performed at 200° C. to 600° C. inclusive, preferably 200° C. to 550° C. inclusive, so that epitaxial growth or axial growth from the surface of the single-component oxide semiconductor layer including single crystal regions is carried out and the second multi-component oxide semiconductor layer including single crystal regions can be formed. That is, the single-component oxide semiconductor layer including single crystal regions is a seed crystal for the second multi-component oxide semiconductor layer including single crystal regions.

Since the crystal growth is carried out with the use of the single-component oxide semiconductor layer including single crystal regions as a seed crystal, the first multi-component oxide semiconductor layer including single crystal regions and the second multi-component oxide semiconductor layer including single crystal regions have substantially the same crystal direction as the single-component oxide semiconductor layer including single crystal regions.

After that, the first multi-component oxide semiconductor layer including single crystal regions, the single-component oxide semiconductor layer including single crystal regions, and the second multi-component oxide semiconductor layer including single crystal regions are etched into an island-shape, a source electrode and a drain electrode are formed over the second multi-component oxide semiconductor layer including single crystal regions which has an island-shape, and a gate insulating layer and a gate electrode are formed, whereby a top-gate transistor can be manufactured.

Alternatively, a gate electrode and a gate insulating layer are formed over a substrate, a first multi-component oxide semiconductor layer including single crystal regions, a single-component oxide semiconductor layer including single crystal regions, and a second multi-component oxide semiconductor layer including single crystal regions are formed over the gate insulating layer, the first multi-component oxide semiconductor layer including single crystal regions, the single-component oxide semiconductor layer including single crystal regions, and the second multi-component oxide semiconductor layer including single crystal regions are etched into an island-shape, and a source electrode and a drain electrode are formed, whereby a bottom-gate transistor can be manufactured.

In addition, according to an embodiment of the present invention, a semiconductor device includes a thin film transistor which has the following: an oxide semiconductor stack including a first multi-component oxide semiconductor layer including single crystal regions, a single-component oxide semiconductor layer including single crystal regions, and a second multi-component oxide semiconductor layer including single crystal regions, a gate electrode, a gate insulating layer provided between the oxide semiconductor stack and the gate electrode, and a wiring electrically connected to the oxide semiconductor stack.

Heat treatment for forming the first multi-component oxide semiconductor layer including single crystal regions and the single-component oxide semiconductor layer including single crystal regions and heat treatment for forming the second multi-component oxide semiconductor layer including single crystal regions are preferably performed in an atmosphere containing almost no hydrogen and moisture (e.g., a nitrogen atmosphere, an oxygen atmosphere, or a dry-air atmosphere). Through the heat treatment, dehydration or dehydrogenation for eliminating hydrogen, water, hydroxyl group, hydride, or the like from the single-component oxide semiconductor layer and the multi-component oxide semiconductor layers can be performed, whereby the first multi-component oxide semiconductor layer including single crystal regions, the single-component oxide semiconductor layer including single crystal regions, and the second multi-component oxide semiconductor layer including single crystal regions can be highly purified. The heat treatment can be performed in the following manner: the temperature is increased in an inert gas atmosphere and then the atmosphere is switched during the process to an atmosphere containing oxygen. In the case where the heat treatment is performed in an oxygen atmosphere, the oxide semiconductor layer is oxidized, whereby an oxygen defect can be repaired. Even when measurement using thermal desorption spectroscopy (TDS) is performed at up to 450° C. on the oxide semiconductor layer including single crystal regions subjected to the heat treatment, at least a peak of water at around 300° C. among two peaks of water is not detected.

When the first multi-component oxide semiconductor layer including single crystal regions and the second multi-component oxide semiconductor layer including single crystal regions each contain In, in a flat-plate-shaped single crystal region, electron clouds of In overlap with each other to be connected to each other, whereby electrical conductivity σ is increased. Therefore, the field-effect mobility of the transistor can be increased.

In the highly purified first multi-component oxide semiconductor including single crystal regions, the highly purified single-component oxide semiconductor including single crystal regions, and the highly purified second multi-component oxide semiconductor including single crystal regions, the hydrogen concentration is lower than or equal to $1\times10^{18}$ cm$^{-3}$, preferably lower than or equal to $1\times10^{16}$ cm$^{-3}$, more preferably substantially 0; the carrier density is lower than $1\times10^{14}$ cm$^3$, preferably lower than $1\times10^{12}$ cm$^3$, more preferably lower than $1.45\times10^{10}$ cm$^3$, which is lower than or equal to the lower limit of measurement; and the band gap is greater than or equal to 2 eV, preferably greater than or equal to 2.5 eV, more preferably greater than or equal to 3 eV.

Note that a transistor according to an embodiment of the present invention includes an insulated-gate field-effect transistor (IGFET) and a thin film transistor (TFT) in its category.

A transistor having a high field-effect mobility can be manufactured and a large-sized display device, a high-performance semiconductor device, and the like are realized even when a material of a substrate serving as a base is any material such as an oxide, a nitride, or metal.

BEST MODE FOR CARRYING OUT THE INVENTION

Figure 1:
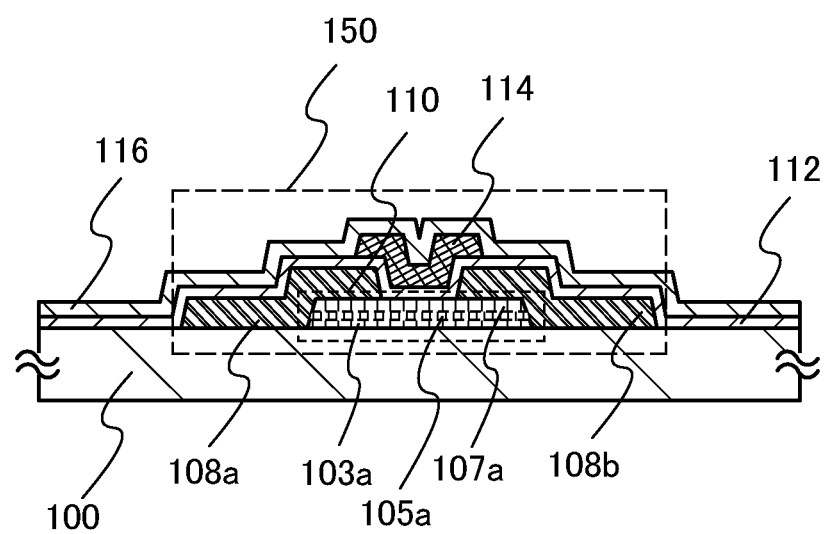
FIG. 1 is a cross-sectional view illustrating a semiconductor device according to an embodiment of the present invention.

Embodiments of the present invention will be described in detail with reference to the accompanying drawings. Note that the present invention is not limited to the following description, and it will be easily understood by those skilled in the art that modes and details thereof can be changed in various ways without departing from the spirit and the scope of the present invention. Therefore, the present invention should not be construed as being limited to the description of the following embodiments. Note that in the structures of the present invention described hereinafter, the same portions or portions having similar functions are denoted by the same reference numerals in different drawings, and description thereof is not repeated.

Note that in each drawing described in this specification, the size of each component or the thickness of each layer or the area is exaggerated in some cases for clarification. Therefore, embodiments of the present invention are not always limited to such scales.

Note that terms such as "first", "second", and "third" in this specification are used in order to avoid confusion between components and do not set a limitation on number. Therefore, for example, description can be made even when "first" is replaced with "second" or "third", as appropriate.

Note that "voltage" indicates a difference between potentials of two points, and "potential" indicates electrostatic energy (electrical potential energy) of a unit charge at a given point in an electrostatic field. Note that in general, a difference between a potential of one point and a reference potential (such as a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Embodiment 1

FIG. 1 is a cross-sectional view illustrating a transistor 150 which is an embodiment of a structure of a semiconductor device. Note that although the transistor 150 described here is an n-channel IGFET (insulated-gate field-effect transistor) whose carriers are electrons, the transistor 150 can be a p-channel IGFET. In this embodiment, the transistor 150 having a top gate structure will be described.

In the transistor 150 illustrated in FIG. 1, a first multi-component oxide semiconductor layer 103a including single crystal regions, a single-component oxide semiconductor layer 105a including single crystal regions, and a second multi-component oxide semiconductor layer 107a including single crystal regions are stacked over a substrate 100 (an oxide semiconductor stack), and wirings 108a and 108b functioning as a source electrode and a drain electrode are formed thereover. In addition, a gate insulating layer 112 is formed over the second multi-component oxide semiconductor layer 107a including single crystal regions and the wirings 108a and 108b, and a gate electrode 114 is formed over the gate insulating layer 112 so as to face the first multi-component oxide semiconductor layer 103a including single crystal regions, the single-component oxide semiconductor layer 105a including single crystal regions, and the second multi-component oxide semiconductor layer 107a including single crystal regions with the gate insulating layer 112 provided therebetween. An insulating layer 116 may be formed over the gate insulating layer 112 and the gate electrode 114.

Next, a method for forming the oxide semiconductor stack including single crystal regions and the thin film transistor formed using the oxide semiconductor stack will be described with reference to FIGS. 2A to 2E, FIG. 3, FIG. 4, FIGS. 5A to 5C, FIGS. 6A and 6B, and FIGS. 7A to 7C.

Figure 2A:
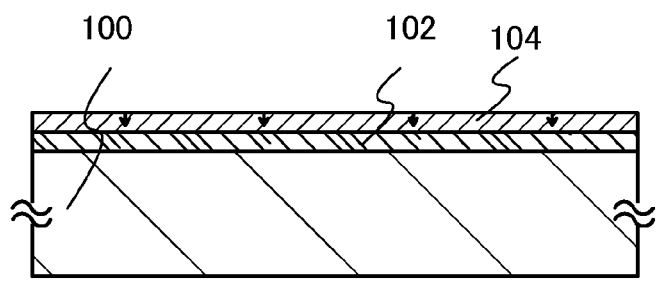
FIGS. 2A to 2E are cross-sectional views illustrating a process for manufacturing a semiconductor device according to an embodiment of the present invention.
Figure 2B:
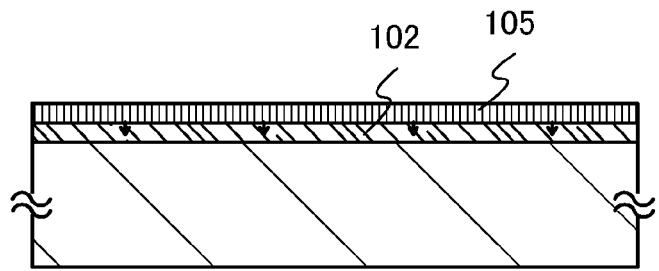
Figure 2C:
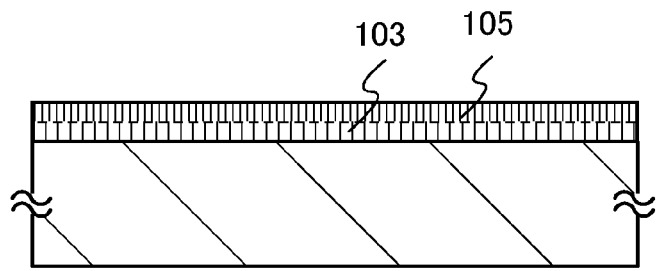

A first multi-component oxide semiconductor layer 102 is formed over the substrate 100, and a single-component oxide semiconductor layer 104 is formed over the first multi-component oxide semiconductor layer 102 (see FIG. 2A).

It is necessary that the substrate 100 at least has enough heat resistance to heat treatment performed later. When a glass substrate is used as the substrate 100, a glass substrate whose strain point is higher than or equal to 730° C. is preferably used. As the glass substrate, for example, a glass material such as aluminosilicate glass, aluminoborosilicate glass, or barium borosilicate glass is used. Note that a glass substrate containing BaO and $B_2O_3$ so that the amount of BaO is larger than that of $B_2O_3$ is preferably used.

Instead of the glass substrate, a substrate formed of an insulator, such as a ceramic substrate, a quartz substrate, or a sapphire substrate can be used. Alternatively, crystallized glass or the like can be used. Further alternatively, a substrate obtained by forming an insulating layer over a surface of a semiconductor substrate such as a silicon wafer or a surface of a conductive substrate formed of a metal material can be used.

As will be described later, according to this embodiment, crystallization of the first multi-component oxide semiconductor layer 102 and the single-component oxide semiconductor layer 104 provided over the substrate 100 does not depend on a material of the substrate which serves as a base. Therefore, various materials can be used for the substrate 100 as described above.

The first multi-component oxide semiconductor layer 102 and the single-component oxide semiconductor layer 104 are formed by a sputtering method or the like. The first multi-component oxide semiconductor layer 102 can have a non-wurtzite crystal structure that is a hexagonal crystal structure by heating. The non-wurtzite crystal structure that is a hexagonal crystal structure is also called a homologous structure. Note that the non-wurtzite crystal structure is a crystal structure which is not a wurtzite type.

As the first multi-component oxide semiconductor layer 102, any of the following oxide semiconductor layers can be used: an In—Sn—Ga—Zn—O-based oxide semiconductor layer which is a four-component metal oxide layer; an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, and a Sn—Al—Zn—O-based oxide semiconductor layer which are three-component metal oxide layers; an In—Zn—O-based oxide semiconductor layer, a Sn—Zn—O-based oxide semiconductor layer, an Al—Zn—O-based oxide semiconductor layer, a Zn—Mg—O-based oxide semiconductor layer, a Sn—Mg—O-based oxide semiconductor layer, and an In—Mg—O-based oxide semiconductor layer which are two-component metal oxide layers; and the like. In this specification, the multi-component oxide semiconductor includes an oxide of plural kinds of metals, and n-component metal oxide includes an oxide of n kinds of metals. Note that the multi-component oxide semiconductor may contain, as an impurity, an element other than the metal oxide that is the main component at 1%, preferably at 0.1%.

The first multi-component oxide semiconductor layer 102 may be formed using a three-component metal oxide, and an oxide semiconductor material represented by $InM_xZn_yO_z$ (Y=0.5 to 5) may be used. Here, M represents one or more kinds of elements selected from Group 13 elements such as gallium (Ga), aluminum (Al), and boron (B). Note that the contents of In, M, Zn, and O can be set freely, and the case where the M content is zero (that is, x=0) is included. The contents of In and Zn are not zero. In other words, the above-described expression includes an In—Ga—Zn—O-based oxide semiconductor, an In—Zn—O-based oxide semiconductor, and the like.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating layer is formed, and a DC sputtering method is mainly used in the case where a metal layer is formed.

As a target used for forming the first multi-component oxide semiconductor layer 102 by a sputtering method, a metal oxide target containing zinc can be used. For example, a metal oxide target containing In, Ga, and Zn has a composition ratio of In:Ga:Zn=1:x:y (x is greater than or equal to 0, and y is greater than or equal to 0.5 and less than or equal to 5). Specifically, a target having a composition ratio of In:Ga:Zn=1:1:0.5 [atomic ratio], a target having a composition ratio of In:Ga:Zn=1:1:1 [atomic ratio], a target having a composition ratio of In:Ga:Zn=1:1:2 [atomic ratio], or a target having a composition ratio of In:Ga:Zn=1:0.5:2 [atomic ratio] can be used. In this embodiment, since crystallization is intentionally caused by performing heat treatment in a later step, it is preferable to use a metal oxide target by which crystallization is easily caused.

The single-component oxide semiconductor layer 104 is preferably formed using a single-component oxide semiconductor which can have a wurtzite crystal structure that is a hexagonal crystal structure by heating, typically, zinc oxide. Here, the single-component oxide semiconductor means an oxide semiconductor including an oxide of one kind of metal. Note that the single-component oxide semiconductor may contain, as an impurity, an element other than the metal oxide at 1%, preferably at 0.1%. The single-component oxide semiconductor is more easily crystallized than the multi-component oxide semiconductor and the degree of crystallinity can be high. The single-component oxide semiconductor layer 104 can be used as a seed crystal for crystal growth of the first multi-component oxide semiconductor layer 102 and a second multi-component oxide semiconductor layer 106 which is formed later. Therefore, the single-component oxide semiconductor layer 104 may have a thickness with which crystal growth is possible, typically greater than or equal to a thickness of one monoatomic layer and less than or equal to 10 nm, preferably 2 nm to 5 nm inclusive. When the single-component oxide semiconductor layer 104 is thin, throughput in film formation treatment and heat treatment can be improved.

The single-component oxide semiconductor layer 104 can be formed by a sputtering method in a rare gas (typically argon) atmosphere, an oxygen atmosphere, or an atmosphere containing a rare gas (typically argon) and oxygen.

In addition, in a manner similar to that of the first multi-component oxide semiconductor layer 102, the relative density of an oxide semiconductor in a metal oxide target is greater than or equal to 80%, preferably greater than or equal to 95%, more preferably greater than or equal to 99.9%.

Further, in a manner similar to that of the first multi-component oxide semiconductor layer 102, by forming the single-component oxide semiconductor layer 104 while heating the substrate, crystal growth can be promoted in first heat treatment performed later.

Next, the first heat treatment is performed. The temperature of the first heat treatment is 500° C. to 1000° C. inclusive, preferably 600° C. to 850° C. inclusive. In addition, heating time is one minute to twenty four hours inclusive.

The first heat treatment is preferably performed in a rare gas (typically, argon) atmosphere, an oxygen atmosphere, a nitrogen atmosphere, a dry air atmosphere, an atmosphere containing a rare gas (typically, argon) and oxygen, or an atmosphere containing a rare gas and nitrogen.

In this embodiment, heat treatment in a dry air atmosphere at 700° C. for one hour is performed as the first heat treatment.

After heating of the single-component oxide semiconductor layer 104 is performed by gradually increasing the temperature thereof, the first multi-component oxide semiconductor layer 102 may be heated at a constant temperature. When the speed for increasing the temperature from a temperature of higher than or equal to 500° C. is 0.5° C./h to 3° C./h inclusive, crystal growth of the single-component oxide semiconductor layer 104 is gradually carried out; thus, the crystallinity can be further enhanced.

A heat treatment apparatus used for the first heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

By the first heat treatment, crystal growth begins from the surface of the single-component oxide semiconductor layer 104 toward the first multi-component oxide semiconductor layer 102 as indicated by arrows in FIG. 2A. Since the single-component oxide semiconductor layer 104 is easily crystallized, the entire single-component oxide semiconductor layer 104 is crystallized, so that a single-component oxide semiconductor layer 105 including single crystal regions is formed. Note that the single-component oxide semiconductor layer 105 including single crystal regions has a wurtzite crystal structure that is a hexagonal crystal structure (see FIG. 2B).

By the first heat treatment, crystal growth is carried out from the surface of the single-component oxide semiconductor layer 104 to form single crystal regions. Each of the single crystal regions is a plate-shaped crystal region obtained by crystal growth from the surface to the inside and has an average thickness of greater than or equal to a thickness of one atomic layer and less than or equal to 10 nm, preferably 2 nm to 5 nm inclusive. Each of the single crystal regions has the a-b plane parallel to the surface and the c-axis perpendicular to the surface. In this embodiment, most part of the single-component oxide semiconductor layer 104 is made to contain crystals (also referred to as a co-growing (CG) crystal) by the first heat treatment. Since crystal growth is carried out from the surface in a depth direction, single crystal regions having relatively uniform crystal direction with respect to the surface of the single-component oxide semiconductor layer 104 can be formed without being influenced by a base component.

By performing the first heat treatment continuously, crystal growth of the first multi-component oxide semiconductor layer 102 proceeds toward the substrate 100 using the single-component oxide semiconductor layer 105 including single crystal regions as a seed crystal, as indicated by arrows. The single-component oxide semiconductor layer 105 including single crystal regions is c-axis aligned perpendicularly to the surface. By using the single-component oxide semiconductor layer 105 including single crystal regions as a seed crystal, crystal growth (epitaxial growth or axial growth) of the first multi-component oxide semiconductor layer 102 can be carried out such that substantially the same crystal axis as the single-component oxide semiconductor layer 105 including single crystal regions is obtained. That is, crystal growth can be carried out while the first multi-component oxide semiconductor layer 102 is c-axis aligned. As a result, a first multi-component oxide semiconductor layer 103 including single crystal regions which is c-axis aligned can be formed. The first multi-component oxide semiconductor layer 103 including single crystal regions has a hexagonal crystal structure which is not a wurtzite crystal structure (see FIG. 2C).

For example, in the case where an In—Ga—Zn—O-based oxide semiconductor material is used for the first multi-component oxide semiconductor layer including single crystal regions, the first multi-component oxide semiconductor layer including single crystal regions can include a crystal represented by $InGaO_3(ZnO)$, such as $InGaZnO_4$ or $InGaZn_5O_8$, a crystal represented by $In_2Ga_2ZnO_7$, or the like. Such a crystal has a hexagonal crystal structure and its c-axis is substantially perpendicular to the surface of the single-component oxide semiconductor layer through the first heat treatment.

Figure 2D:
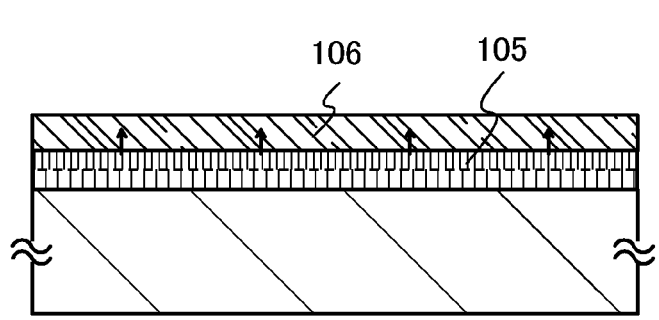

Next, as illustrated in FIG. 2D, the second multi-component oxide semiconductor layer 106 is formed over the single-component oxide semiconductor layer 105 including single crystal regions. The second multi-component oxide semiconductor layer 106 can have a non-wurtzite crystal structure that is a hexagonal crystal structure by heating. The second multi-component oxide semiconductor layer 106 can be formed by a method similar to that of the single-component oxide semiconductor layer 104. Note that the thickness of the second multi-component oxide semiconductor layer 106 may be determined as appropriate in accordance with a device to be manufactured, by a practitioner. For example, the total thickness of the first multi-component oxide semiconductor layer 102, the single-component oxide semiconductor layer 104, and the second multi-component oxide semiconductor layer 106 is 10 nm to 200 nm inclusive.

The second multi-component oxide semiconductor layer 106 can be formed using a material and a method which are similar to those of the first multi-component oxide semiconductor layer 102 as appropriate.

Next, second heat treatment is performed. The temperature of the second heat treatment is 100° C. to 500° C. inclusive, preferably 150° C. to 400° C. inclusive. The heating time is set to 1 minute to 100 hours inclusive, preferably 5 hours to 20 hours inclusive, typically 10 hours.

Note that the second heat treatment can be performed in an atmosphere similar to that of the first heat treatment. In addition, a heating apparatus similar to that of the first heat treatment can be used as appropriate for the second heat treatment.

By performing the second heat treatment, crystal growth begins from the single-component oxide semiconductor layer 105 including single crystal regions toward the surface of the second multi-component oxide semiconductor layer 106 as indicated by arrows in FIG. 2D. The single-component oxide semiconductor layer 105 including single crystal regions is c-axis aligned perpendicularly to the surface. By using the single-component oxide semiconductor layer 105 including single crystal regions as a seed crystal, crystal growth (epitaxial growth or axial growth) of the second multi-component oxide semiconductor layer 106 can be carried out such that substantially the same crystal axis as the single-component oxide semiconductor layer 105 including single crystal regions is obtained, in a manner similar to that of the first multi-component oxide semiconductor layer 102. That is, crystal growth can be carried out while the second multi-component oxide semiconductor layer 106 is c-axis aligned. Through the above process, a second multi-component oxide semiconductor layer 107 including single crystal regions can be formed. The second multi-component oxide semiconductor layer 107 including single crystal regions has a hexagonal crystal structure which is not a wurtzite crystal structure (see FIG. 2E).

For example, in the case where an In—Ga—Zn—O-based oxide semiconductor material is used for the second multi-component oxide semiconductor layer including single crystal regions, the second multi-component oxide semiconductor layer including single crystal regions can include a crystal represented by $InGaO_3(ZnO)_m$ such as $InGaZnO_4$ or $InGaZn_5O_8$, a crystal represented by $In_2Ga_2ZnO_7$, or the like. Such a crystal has a hexagonal crystal structure and its c-axis is substantially perpendicular to the surface of the second multi-component oxide semiconductor layer through the second heat treatment.

Here, a crystal in which the c-axis is substantially perpendicular to the surface of the first multi-component oxide semiconductor layer 102 and the second multi-component oxide semiconductor layer 106 has a stacked structure of layers containing any of In, Ga, and Zn, parallel to the a-axis and b-axis. Specifically, a crystal of $In_2Ga_2ZnO_7$, $InGaZnO_4$, or $InGaZn_5O_8$ has a structure in which a layer that contains In and a layer that does not contain In (a layer that contains Ga or Zn) are stacked in the c-axis direction.

In the In—Ga—Zn—O-based oxide semiconductor, the conductivity of a layer that contains In in a direction of the a-b plane is favorable. This is due to the fact that electrical conductivity is mainly controlled by In in the In—Ga—Zn—O-based oxide semiconductor and the fact that the 5 s orbital of one In atom overlaps with the 5 s orbital of an adjacent In atom and thereby a carrier path is formed. Further, since the transistor described in this embodiment includes the first multi-component oxide semiconductor layer including single crystal regions, the single-component oxide semiconductor layer including single crystal regions, and the second multi-component oxide semiconductor layer including single crystal regions which are highly crystallized, the transistor has fewer impurities and defects than a transistor including an amorphous, microcrystalline, or polycrystalline oxide semiconductor layer. As described above, carrier mobility of the first multi-component oxide semiconductor layer including single crystal regions, the single-component oxide semiconductor layer including single crystal regions, and the second multi-component oxide semiconductor layer including single crystal regions can be improved, whereby on-state current and field-effect mobility of the transistor can be enhanced.

Figure 3:
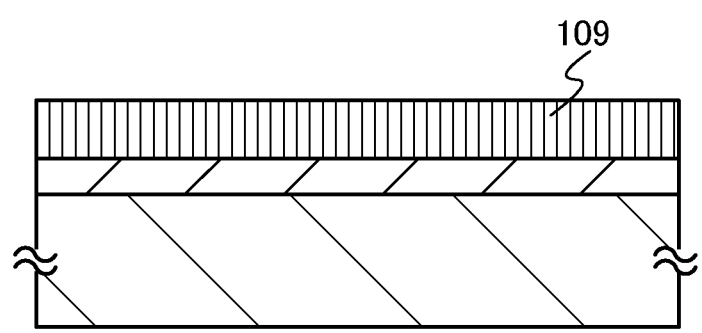
FIG. 3 is a cross-sectional view illustrating a process for manufacturing a semiconductor device according to an embodiment of the present invention.

Here, an interface between the first multi-component oxide semiconductor layer 103 including single crystal regions and the single-component oxide semiconductor layer 105 including single crystal regions and an interface between the single-component oxide semiconductor layer 105 including single crystal regions and the second multi-component oxide semiconductor layer 107 including single crystal regions are denoted by dotted lines. However, when the single-component oxide semiconductor layer 105 including single crystal regions is ZnO and the first multi-component oxide semiconductor layer 103 including single crystal regions and the second multi-component oxide semiconductor layer 107 including single crystal regions are an In—Ga—Zn—O-based oxide semiconductor, zinc contained in ZnO or the In—Ga—Zn—O-based oxide semiconductor is diffused due to the pressure and temperature of the heat treatment. Diffusion of zinc is recognized because, when TDS is performed at a temperature up to 450° C., a peak of In or Ga is not detected but a peak of zinc is detected particularly at around 300° C. under vacuum heating conditions. Note that TDS is performed in vacuum, and it is found that zinc is detected from a temperature of about 200° C. Accordingly, as illustrated in FIG. 3, there is also the case where a boundary between the first multi-component oxide semiconductor layer including single crystal regions and the single-component oxide semiconductor layer including single crystal regions and a boundary between the single-component oxide semiconductor layer including single crystal regions and the second multi-component oxide semiconductor layer including single crystal regions are not clear and these layers can be regarded as one layer, i.e., a layer 109.

Through the above process, the first multi-component oxide semiconductor layer 103 including single crystal regions, the single-component oxide semiconductor layer 105 including single crystal regions, and the second multi-component oxide semiconductor layer 107 including single crystal regions can be formed.

Now, a mechanism for forming the plate-shaped crystal regions in the single-component oxide semiconductor layer 104 through the first heat treatment will be described with reference to FIG. 4, FIGS. 5A to 5C, and FIGS. 6A and 6B.

Motion of atoms in the first heat treatment was examined by a classical molecular dynamics method. An empirical potential which characterizes the interaction between atoms is defined in a classical molecular dynamics method, so that force that acts on each atom can be evaluated. Here, a law of classical mechanics was applied to each atom and Newton's equation of motion was numerically solved, whereby motion (time-dependent change) of each atom was examined. In this calculation, a Born-Mayer-Huggins potential was used as the empirical potential.

Figure 4:
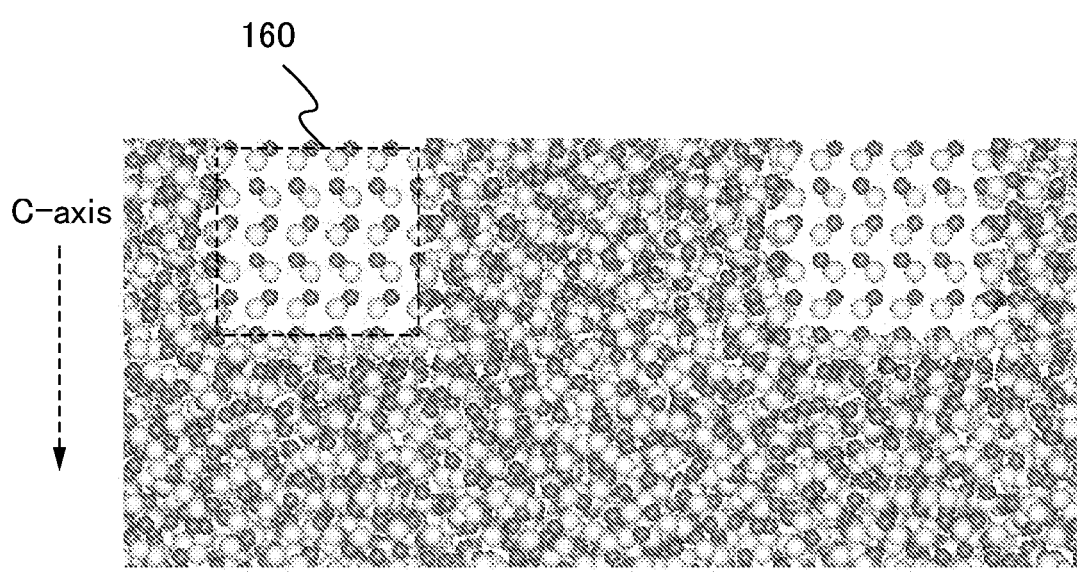
FIG. 4 is a diagram illustrating a process of crystal growth of an oxide semiconductor layer.

A model in which crystal nuclei 160 that are single crystal zinc oxide (hereinafter referred to as c-ZnO) having a width of 1 nm are provided at equal intervals in amorphous zinc oxide (hereinafter referred to as a-ZnO) was formed as illustrated in FIG. 4. Note that the density of a-ZnO and c-ZnO was 5.5 g/cm$^3$. The vertical direction was a c-axis direction.

Next, the model in FIG. 4 was subjected to classical molecular dynamics simulation at 700° C. for 100 psec (0.2 fsec×500,000 steps) while fixing c-ZnO under three-dimensional periodic boundary conditions. Results thereof are shown in FIGS. 5A to 5C and FIGS. 6A and 6B.

Figure 5A:
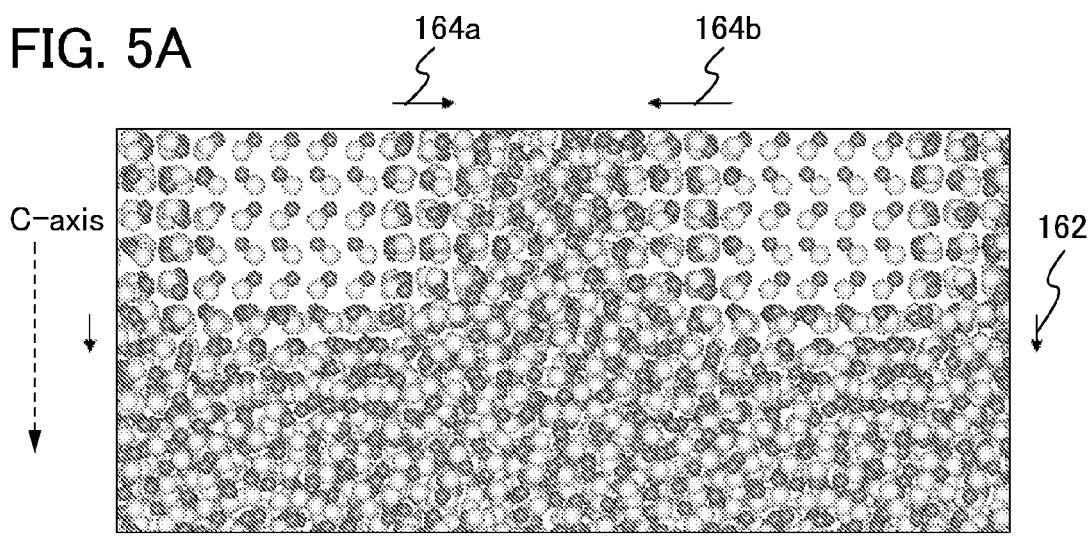
FIGS. 5A to 5C are diagrams each illustrating a process of crystal growth of an oxide semiconductor layer.
Figure 5B:
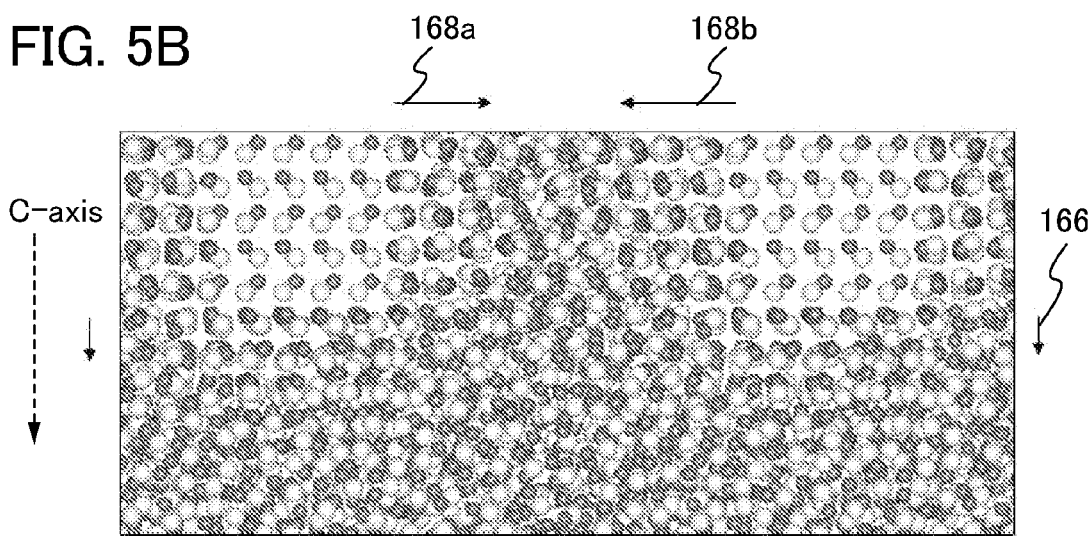
Figure 5C:
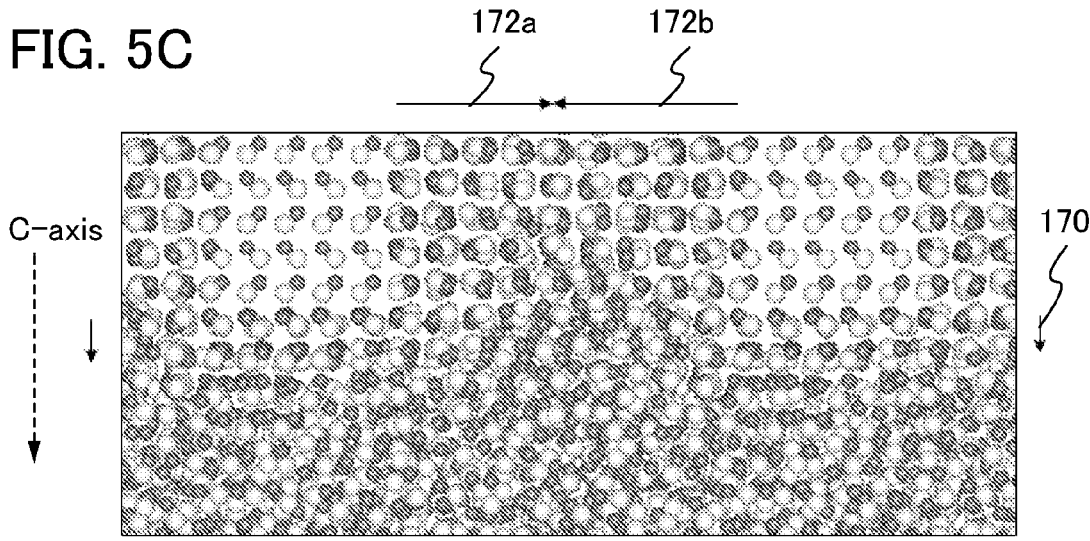
Figure 6A:
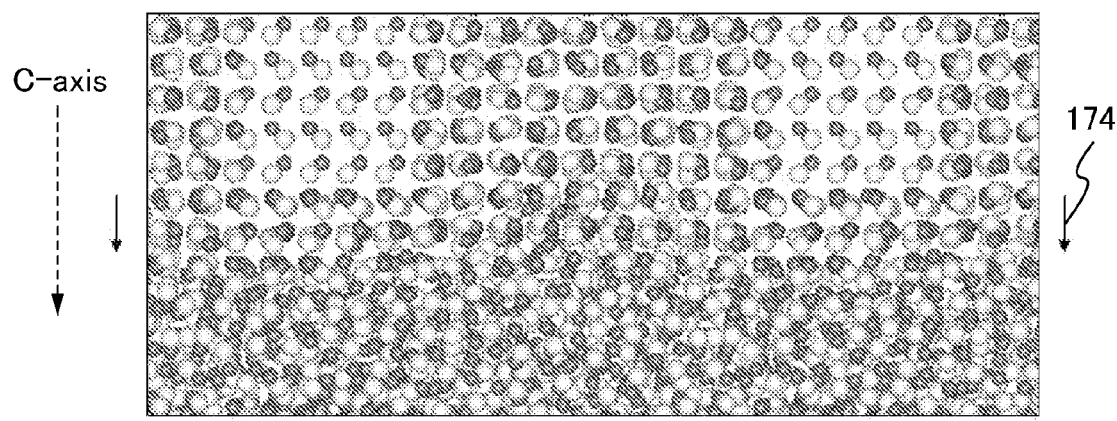
FIGS. 6A and 6B are diagrams each illustrating a process of crystal growth of an oxide semiconductor layer.
Figure 6B:
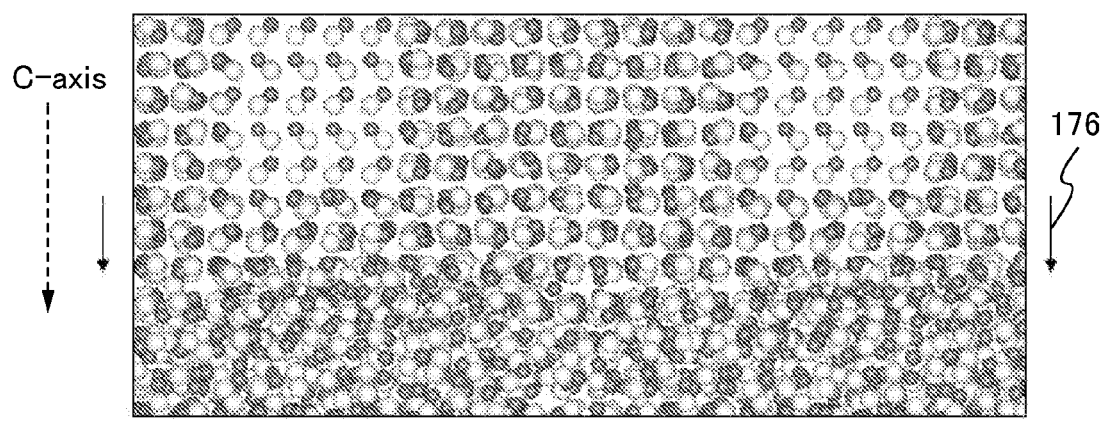

FIGS. 5A, 5B, and 5C respectively show the changes of atomic positions after 20 psec, 40 psec, and 60 psec. FIGS. 6A and 6B respectively show the changes of atomic positions after 80 psec and 100 psec. In each drawing, the distance and direction of crystal growth are denoted by the length and pointing direction of arrows.

Table 1 shows crystal growth rates in a vertical direction (c-axis [0001]) and a horizontal direction perpendicular to the vertical direction.

TABLE 1

| Direction | Crystal growth rates (nm/psec) |
|---|---|
| Vertical | $6.1 \times 10^{-3}$ |
| Horizontal | $3.0 \times 10^{-2}$ |

In FIGS. 5A to 5C, arrows 164a, 164b, 168a, 168b, 172a, and 172b in a horizontal direction (a direction perpendicular to a c-axis direction) are longer than arrows 162, 166, and 170 in a vertical direction (the c-axis direction). Therefore, it is found that crystal growth in a horizontal direction is preferential and that the crystal growth is finished between adjacent crystal nuclei in FIG. 5C.

In FIGS. 6A and 6B, it is found that crystal growth is carried out in a vertical direction (the c-axis direction) using crystal regions formed at the surface as seed crystals as indicated by arrows 174 and 176.

In addition, according to Table 1, it is found that the crystal growth rate in the horizontal direction perpendicular to the vertical direction (c-axis [0001]) is about 4.9 times higher than that in the vertical direction. Therefore, crystal growth first proceeds in a direction parallel to the surface (the a-b plane) in ZnO. At this time, in the a-b plane, crystal growth proceeds in the horizontal direction to form plate-shaped single crystal regions. Next, using the plate-shaped single crystal regions formed at the surface (the a-b plane) as seed crystals, crystal growth proceeds in the c-axis direction perpendicular to the surface (the a-b plane). Therefore, it is assumed that ZnO is likely to be c-axis aligned. As described above, after the crystal growth preferentially proceeds in the direction parallel to the surface (the a-b plane), crystal growth (also referred to as epitaxial growth or axial growth) proceeds in the c-axis direction perpendicularly to the surface, whereby the plate-shaped single crystal regions are formed.

Next, a mechanism of crystal growth in which the crystal axis of the first multi-component oxide semiconductor layer 103 including single crystal regions and the crystal axis of the second multi-component oxide semiconductor layer 107 including single crystal regions are substantially equal to the crystal axis of the single-component oxide semiconductor layer 105 including single crystal regions is described with reference to FIGS. 7A to 7C.

Figure 7A:
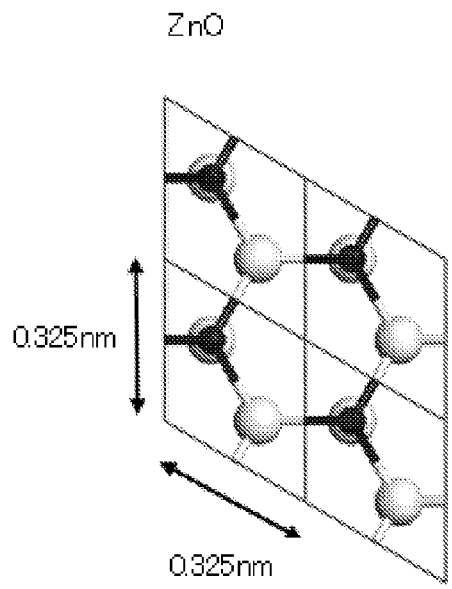
FIGS. 7A to 7C are diagrams each illustrating a crystal structure of an oxide semiconductor layer.
Figure 7B:
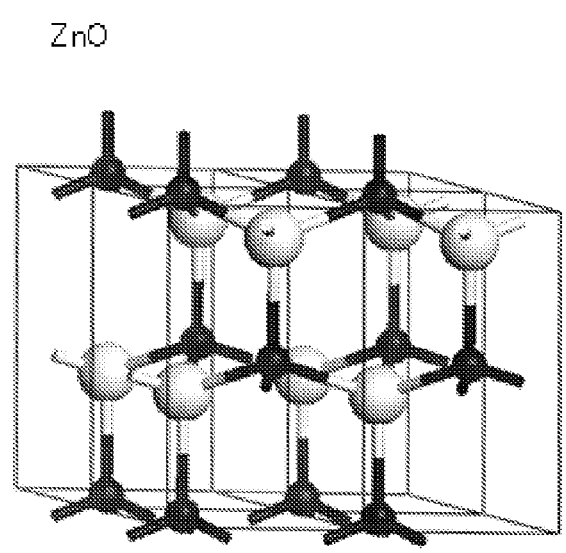

FIG. 7A shows the structure of a unit cell in the a-b plane in which zinc oxide (ZnO) having a hexagonal crystal structure that is a typical example of the single-component oxide semiconductor layer is observed from the c-axis direction. FIG. 7B shows the crystal structure in which the c-axis direction is a vertical direction.

Figure 7C:
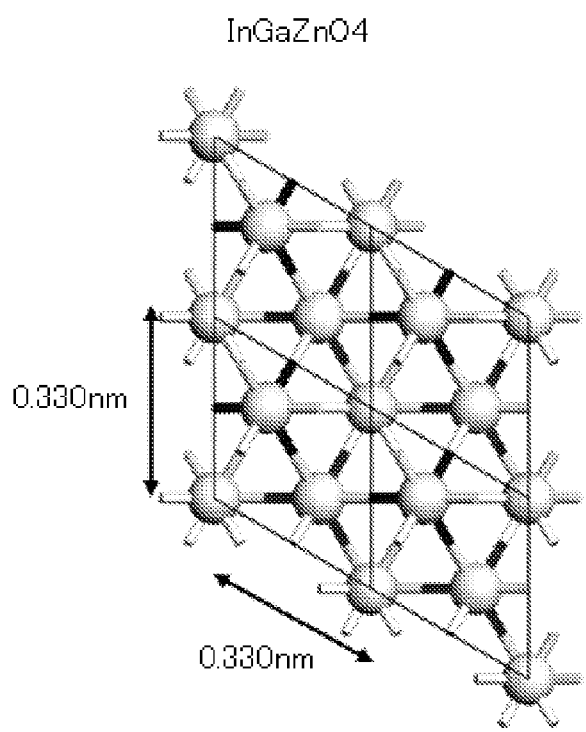

FIG. 7C shows the structure in the a-b plane in which $InGaZnO_4$ that is a typical example of the first multi-component oxide semiconductor layer and the second multi-component oxide semiconductor layer is observed from the c-axis direction.

According to FIGS. 7A and 7C, lattice constants of ZnO and $InGaZnO_4$ are substantially the same, and ZnO and $InGaZnO_4$ have high consistency with each other in the a-b plane. In addition, ZnO and $InGaZnO_4$ have a hexagonal crystal structure and ZnO has a bond parallel to the c-axis direction; therefore, crystal growth can be carried out in the c-axis direction with high consistency in $InGaZnO_4$ that is a typical example of the first multi-component oxide semiconductor layer and the second multi-component oxide semiconductor layer. Accordingly, crystal growth is carried out such that the crystal axis of the first multi-component oxide semiconductor layer 103 including single crystal regions and the crystal axis of the second multi-component oxide semiconductor layer 107 including single crystal regions are substantially equal to the crystal axis of the single-component oxide semiconductor layer 105 including single crystal regions.

Through the above steps, a stack having the first multi-component oxide semiconductor layer including single crystal regions, the single-component oxide semiconductor layer including single crystal regions, and the second multi-component oxide semiconductor layer including single crystal regions can be formed without being influenced by a material of the substrate which serves as a base.

Figure 2E:
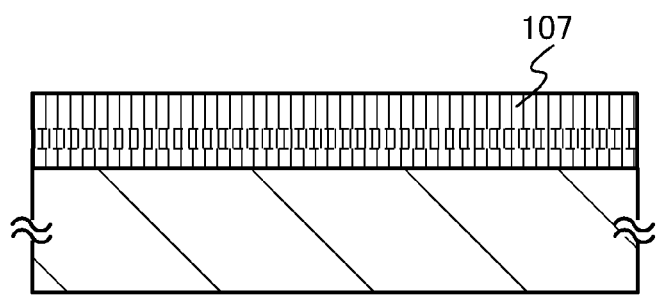

Then, a resist mask is formed by a photolithography step over the second multi-component oxide semiconductor layer 107 including single crystal regions illustrated in FIG. 2E. After that, the first multi-component oxide semiconductor layer 103 including single crystal regions, the single-component oxide semiconductor layer 105 including single crystal regions, and the second multi-component oxide semiconductor layer 107 including single crystal regions are etched by using the resist mask, whereby the island-shaped first multi-component oxide semiconductor layer 103a including single crystal regions, the island-shaped single-component oxide semiconductor layer 105a including single crystal regions, and the island-shaped second multi-component oxide semiconductor layer 107a including single crystal regions are formed. The first multi-component oxide semiconductor layer 103a including single crystal regions, the single-component oxide semiconductor layer 105a including single crystal regions, and the second multi-component oxide semiconductor layer 107a including single crystal regions are also referred to as an oxide semiconductor stack 110 (see FIG. 1).

Next, after a conductive layer is formed over the oxide semiconductor stack 110, the conductive layer is etched into a desired shape, whereby the wirings 108a and 108b are formed.

The wirings 108a and 108b can be formed using a metal element selected from aluminum, chromium, copper, tantalum, titanium, molybdenum, and tungsten, an alloy containing any of these metal elements as a component, an alloy containing any of these metal elements in combination, or the like. Alternatively, one or more metal elements selected from manganese, magnesium, zirconium, and beryllium may be used. In addition, the wirings 108a and 108b can have a single-layer structure or a stacked structure having two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer which contains aluminum and one or more of elements selected from titanium, tantalum, tungsten, molybdenum, chromium, neodymium, and scandium may be used.

Alternatively, as the wirings 108a and 108b, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used. It is also possible to have a stacked structure formed using the above light-transmitting conductive material and the above metal element.

Next, the gate insulating layer 112 is formed over the oxide semiconductor stack 110, and the wirings 108a and 108b.

The gate insulating layer 112 can be formed with a single layer or a stacked layer using one or more of a silicon oxide layer, a silicon nitride layer, a silicon oxynitride layer, a silicon nitride oxide layer, and an aluminum oxide layer. A portion of the gate insulating layer 112 which is in contact with the oxide semiconductor stack 110 preferably contains oxygen, and in particular, the portion of the gate insulating layer 112 is preferably formed using a silicon oxide layer. The use of a silicon oxide layer makes it possible to supply oxygen to the oxide semiconductor stack 110; thus, favorable characteristics can be obtained.

When the gate insulating layer 112 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be reduced. Further, a stacked structure in which a high-k material and one or more of a silicon oxide layer, a silicon nitride layer, a silicon oxynitride layer, a silicon nitride oxide layer, and an aluminum oxide layer are stacked can be used. The thickness of the gate insulating layer 112 may be 50 nm to 500 nm inclusive. When the thickness of the gate insulating layer 112 is large, gate leakage current can be reduced.

Next, the gate electrode 114 is formed over the gate insulating layer 112 in a region overlapping with the oxide semiconductor stack 110.

The gate electrode 114 can be formed using a metal element selected from aluminum, chromium, copper, tantalum, titanium, molybdenum, and tungsten, an alloy containing any of these metal elements as a component, an alloy containing any of these metal elements in combination, or the like. Alternatively, one or more metal elements selected from manganese, magnesium, zirconium, and beryllium may be used. Further, the gate electrode 114 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer which contains aluminum and one or more elements selected from titanium, tantalum, tungsten, molybdenum, chromium, neodymium, and scandium may be used.

Alternatively, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used as the gate electrode 114. It is also possible to have a stacked structure formed using the above light-transmitting conductive material and the above metal element.

After that, the insulating layer 116 may be formed as a protective layer. Through the above steps, the transistor 150 having the oxide semiconductor stack including single crystal regions for a channel formation region can be formed. Although any metal oxide which has been already reported is in an amorphous state or a polycrystalline state or can be in a single crystal state only by a treatment at a temperature as high as around 1400° C., a transistor which has an oxide semiconductor including single crystal regions for a channel formation region can be formed with the use of a large-area substrate at a relatively low temperature by the above-described method in which a single-component oxide semiconductor layer including a flat-plate-shaped single crystal region is formed and then crystal growth is carried out with the use of the single crystal regions as a seed crystal.

Embodiment 2

In this embodiment, a manufacturing method of a transistor including a highly purified oxide semiconductor stack will be described as a manufacturing method of a semiconductor device according to an embodiment of the invention disclosed herein with reference to FIGS. 8A to 8E, FIGS. 9A to 9D, and FIGS. 10A and 10B.

An insulating layer 101 is formed over a substrate 100. Then, in a manner similar to that in Embodiment 1, a first multi-component oxide semiconductor layer 102 is formed over the insulating layer 101, and a single-component oxide semiconductor layer 104 is formed over the first multi-component oxide semiconductor layer 102 (see FIG. 8A).

As the substrate 100, the substrate 100 described in Embodiment 1 can be used as appropriate.

The insulating layer 101 is provided so as to reduce entry of an impurity into a layer formed over the substrate 100 and to enhance adhesion to the layer formed over the substrate 100. The insulating layer 101 is formed using an oxide insulating layer such as a silicon oxide layer or a silicon oxynitride layer, or a nitride insulating layer such as a silicon nitride layer, a silicon nitride oxide layer, an aluminum nitride layer, or an aluminum nitride oxide layer. In addition, the insulating layer 101 may have a stacked structure, for example, a stacked structure in which one or more of the above nitride insulating layers and one or more of the above oxide insulating layers are stacked in that order over the substrate 100. There is no particular limitation on the thickness of the insulating layer 101; the insulating layer 101 can have a thickness of 10 nm to 500 nm inclusive, for example. The insulating layer 101 is not an essential component; therefore, a structure in which the insulating layer 101 is not provided is also possible.

The insulating layer 101 can be formed by a sputtering method, a CVD method, a coating method, a printing method, or the like.

Note that when the insulating layer 101 is formed by a sputtering method, the insulating layer 101 is preferably formed while hydrogen, water, hydroxyl group, hydride, or the like remaining in a treatment chamber is removed. This is for preventing hydrogen, water, hydroxyl group, hydride, or the like from being contained in the insulating layer 101. It is preferable to use an entrapment vacuum pump in order to remove hydrogen, water, hydroxyl group, hydride, or the like remaining in the treatment chamber. As the entrapment vacuum pump, for example, a cryopump, an ion pump, or a titanium sublimation pump is preferably used. In addition, an evacuation unit may be a turbo pump provided with a cold trap. Hydrogen, water, hydroxyl group, hydride, or the like is removed from the treatment chamber which is evacuated with a cryopump; thus, when the insulating layer 101 is formed in the treatment chamber, the concentration of impurities contained in the insulating layer 101 can be reduced.

In addition, it is preferable to use a high-purity gas from which impurities such as hydrogen, water, hydroxyl group, or hydride are removed to a concentration of several ppm or several ppb, as a sputtering gas when the insulating layer 101 is formed.

In this embodiment, the substrate 100 is transferred to the treatment chamber, a sputtering gas containing high-purity oxygen, from which hydrogen, water, hydroxyl group, hydride, or the like is removed, is introduced into the treatment chamber, and a silicon oxide layer is formed as the insulating layer 101 over the substrate 100 using a silicon target. Note that when the insulating layer 101 is formed, the substrate 100 may be heated.

When the first multi-component oxide semiconductor layer 102 and the single-component oxide semiconductor layer 104 are formed by a sputtering method, by heating the substrate, impurities such as hydrogen, water, hydroxyl group, or hydride contained in the first multi-component oxide semiconductor layer 102 and the single-component oxide semiconductor layer 104 can be reduced, and crystal growth can be promoted in first heat treatment performed later.

The relative density of a metal oxide in a metal oxide target is greater than or equal to 80%, preferably greater than or equal to 95%, more preferably greater than or equal to 99.9%. By using a target having high relative density, the impurity concentration in the first multi-component oxide semiconductor layer 102 and the single-component oxide semiconductor layer 104 which are formed can be reduced, and a transistor having excellent electric characteristics or high reliability can be obtained.

Preheat treatment is preferably performed before the first multi-component oxide semiconductor layer 102 and the single-component oxide semiconductor layer 104 are formed, in order to remove hydrogen, water, hydroxyl group, hydride, or the like which remains on the inner wall of the sputtering apparatus, on a surface of a target, or inside a target material. As the preheat treatment, a method in which the inside of the chamber is heated to 200° C. to 600° C. under reduced pressure, a method in which introduction and removal of nitrogen or an inert gas are repeated, and the like can be given. After the preheat treatment, the substrate or the sputtering apparatus is cooled. Then, the first multi-component oxide semiconductor layer 102 and the single-component oxide semiconductor layer 104 are formed without exposure to the air. In this case, not water but oil or the like is preferably used as a coolant for the target. Although a certain level of effect can be obtained when introduction and removal of nitrogen or an inert gas are repeated without performing heating, it is more preferable to perform the above treatment while performing heating.

In addition, in a manner similar to that of the insulating layer 101, hydrogen, water, hydroxyl group, hydride, or the like remaining in the sputtering apparatus is preferably removed before, during, or after the formation of the first multi-component oxide semiconductor layer 102 and the single-component oxide semiconductor layer 104. In order to remove residual moisture from the sputtering apparatus, an entrapment vacuum pump is preferably used. As a result, hydrogen, water, hydroxyl group, hydride, or the like is removed, so that the concentration of impurities contained in the first multi-component oxide semiconductor layer 102 and the single-component oxide semiconductor layer 104 can be reduced.

Next, in a manner similar to that in Embodiment 1, first heat treatment is performed. The temperature of the first heat treatment is 500° C. to 1000° C. inclusive, preferably 600° C. to 850° C. inclusive. In addition, heating time is one minute to twenty four hours inclusive. Through the first heat treatment, a first multi-component oxide semiconductor layer 103 including single crystal regions and a single-component oxide semiconductor layer 105 including single crystal regions can be formed (see FIG. 8B).

In the first heat treatment, not only is crystal growth carried out in the first multi-component oxide semiconductor layer 102 and the single-component oxide semiconductor layer 104 but impurities that are not main components of the oxide semiconductor, typically, hydrogen, water, hydroxyl group, or hydride are removed, so that the oxide semiconductor layers can be highly purified.

The first heat treatment is preferably performed in a rare gas (typically, argon) atmosphere, an oxygen atmosphere, a nitrogen atmosphere, a dry air atmosphere, an atmosphere containing a rare gas (typically, argon) and oxygen, or an atmosphere containing a rare gas and nitrogen. Specifically, a high-purity gas atmosphere is preferably used, in which the concentration of impurities such as hydrogen, water, hydroxyl group, or hydride are reduced to several ppm or several ppb.

In this embodiment, heat treatment in a dry air atmosphere at 700° C. for one hour is performed as the first heat treatment.

Next, in a manner similar to that in Embodiment 1, a second multi-component oxide semiconductor layer 106 is formed over the single-component oxide semiconductor layer 105 including single crystal regions.

Next, in a manner similar to that in Embodiment 1, second heat treatment is performed. Through the second heat treatment, a second multi-component oxide semiconductor layer 107 including single crystal regions can be formed (see FIG. 8C).

In the second heat treatment, not only is crystal growth carried out in the second multi-component oxide semiconductor layer 106, but impurities that are not main components of the oxide semiconductor, typically, hydrogen, water, hydroxyl group, or hydride are removed, so that the oxide semiconductor layer can be highly purified.

At the time of increasing the temperature in the first heat treatment and the second heat treatment, an atmosphere in a furnace may be a nitrogen atmosphere, and the atmosphere may be switched to an oxygen atmosphere at the time of performing cooling. The inside of the first multi-component oxide semiconductor layer 102, the single-component oxide semiconductor layer 104, and the second multi-component oxide semiconductor layer 106 can be supplied with oxygen so as to be i-type oxide semiconductor layers by switching the nitrogen atmosphere in which dehydration or dehydrogenation is performed to the oxygen atmosphere after the dehydration or dehydrogenation.

Figure 8A:
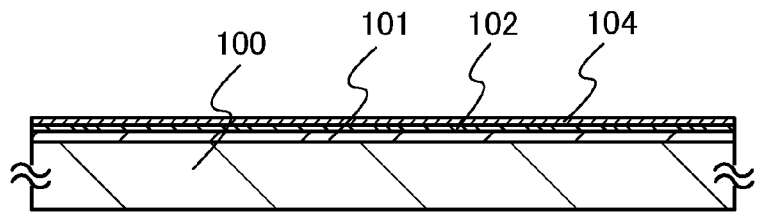
FIGS. 8A to 8E are cross-sectional views illustrating a process for manufacturing a semiconductor device according to an embodiment of the present invention.
Figure 8B:
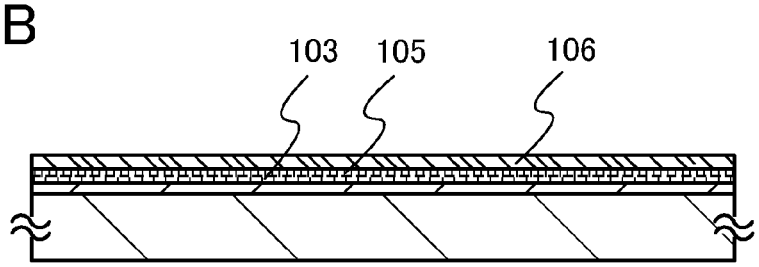
Figure 8C:
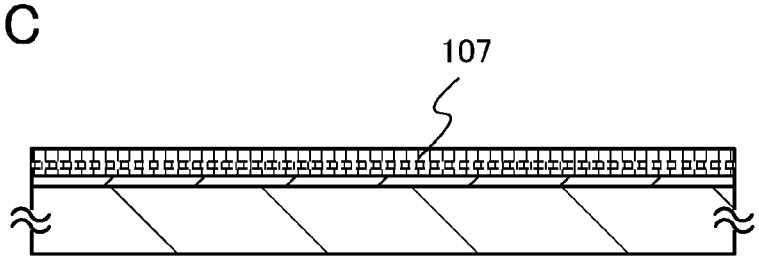
Figure 8D:
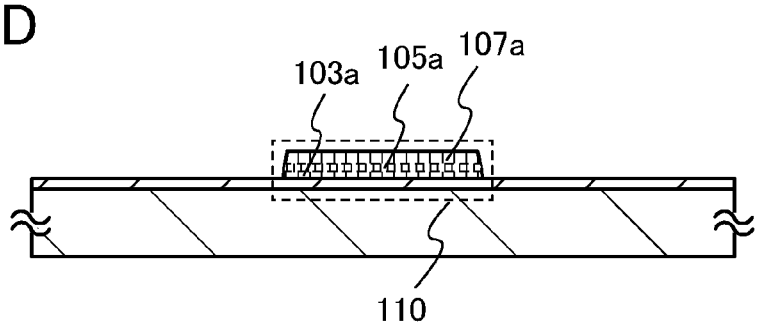

Through the above process, the first multi-component oxide semiconductor layer 103 including single crystal regions, the single-component oxide semiconductor layer 105 including single crystal regions, and the second multi-component oxide semiconductor layer 107 including single crystal regions can be formed (see FIG. 8C).

Then, a resist mask is formed by a photolithography step over the second multi-component oxide semiconductor layer 107 including single crystal regions. After that, the first multi-component oxide semiconductor layer 103 including single crystal regions, the single-component oxide semiconductor layer 105 including single crystal regions, and the second multi-component oxide semiconductor layer 107 including single crystal regions are etched by using the resist mask, whereby a first multi-component oxide semiconductor layer 103a including single crystal regions, a single-component oxide semiconductor layer 105a including single crystal regions, and a second multi-component oxide semiconductor layer 107a including single crystal regions which have an island-shape are formed (see FIG. 8D). The resist mask may be formed by an ink jet method. Formation of the resist mask by an ink jet method needs no photomask; thus, manufacturing cost can be reduced. Hereinafter, the first multi-component oxide semiconductor layer 103a including single crystal regions, the single-component oxide semiconductor layer 105a including single crystal regions, and the second multi-component oxide semiconductor layer 107a including single crystal regions are also referred to as an oxide semiconductor stack 110.

In the etching, a dry etching method or a wet etching method can be used. As an etchant used for wet etching, a solution obtained by mixing phosphoric acid, acetic acid, and nitric acid, an ammonia hydrogen peroxide (hydrogen peroxide at 31 wt %: ammonia water at 28 wt %: water=5:2:2), or the like can be used. In addition, ITO07N (produced by KANTO CHEMICAL CO., INC.) may be used.

The etchant after the wet etching is removed together with the material etched off by cleaning. The waste liquid including the etchant and the material etched off may be purified and the material may be reused. When a material such as indium is collected from the waste liquid after the etching and reused, the resources can be efficiently used and the cost can be reduced.

As an etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As a dry etching method, a parallel plate RIE (reactive ion etching) method or an ICP (inductively coupled plasma) etching method can be used. In order to etch the layer into a desired shape, the etching condition (the amount of electric power applied to a coil-shaped electrode, the amount of electric power applied to an electrode on a substrate side, the temperature of the electrode on the substrate side, or the like) is adjusted as appropriate.

Figure 8E:
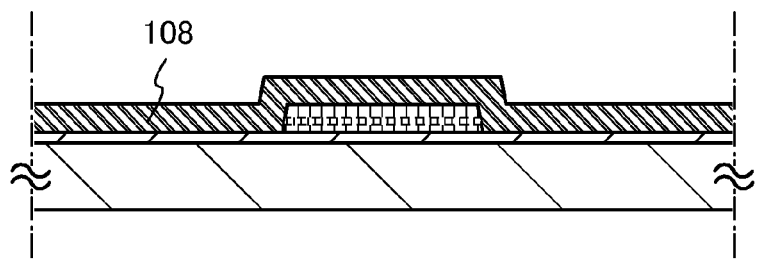

Next, a conductive layer 108 is formed over the insulating layer 101 and the island-shaped oxide semiconductor layers (see FIG. 8E). The conductive layer 108 is formed into wirings 108a and 108b later.

The conductive layer 108 can be formed using a material which is used for the wirings 108a and 108b described in Embodiment 1 as appropriate. The conductive layer 108 is formed by a sputtering method, a CVD method, or a vacuum evaporation method. In this embodiment, as the conductive layer 108, a metal layer including three layers of a titanium layer with a thickness of 50 nm, an aluminum layer with a thickness of 100 nm, and a titanium layer with a thickness of 50 nm, each formed by a sputtering method, is used.

Figure 9A:
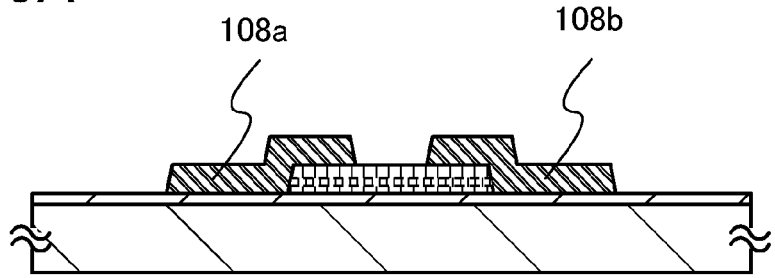
FIGS. 9A to 9D are cross-sectional views illustrating a process for manufacturing a semiconductor device according to an embodiment of the present invention.

Next, a resist mask is formed over the conductive layer 108 by a photolithography step, and the conductive layer 108 is etched with the use of the resist mask, so that the wirings 108a and 108b functioning as a source electrode and a drain electrode are formed (see FIG. 9A). Alternatively, when the wirings 108a and 108b are formed by a printing method or an ink jet method without using a photolithography step, the number of steps can be reduced.

In light exposure performed on a resist for forming a resist mask that is used in etching, it is preferable to use ultraviolet light, a KrF laser beam, or an ArF laser beam. Particularly for light exposure in the case where the channel length (L) is shorter than 25 nm, a resist is preferably exposed to extreme ultraviolet light whose wavelength is several nanometers to several tens of nanometers, which is extremely short. In light exposure using extreme ultraviolet light, resolution is high and the depth of focus is large. Therefore, the channel length (L) of a transistor, which is formed later, can be 10 nm to 1000 nm (1 µm) inclusive. By a decrease in channel length by such a method, operation speed of the transistor can be improved. In addition, off-state current of a transistor including the above-described oxide semiconductor is very small; thus, an increase in power consumption due to miniaturization of the transistor can be suppressed.

The material of the oxide semiconductor stack 110 and the material and etching conditions of the conductive layer 108 are adjusted as appropriate so that the oxide semiconductor stack 110 is not removed at the time of etching the conductive layer 108. Note that in some cases, the oxide semiconductor stack 110 is partly etched in the etching step and thus has a groove portion (a recessed portion) depending on the materials and the etching conditions.

In addition, a crystal region on the side surface of the oxide semiconductor stack 110 which is in contact with the wiring 108a or 108b is in an amorphous state in some cases.

Note that the etching of the conductive layer 108 may be performed using either dry etching or wet etching, or using both dry etching and wet etching. In order to form the wirings 108a and 108b having a desired shape, an etching condition (etchant, etching time, temperature, or the like) is adjusted as appropriate in accordance with the material.

In this embodiment, ammonia hydrogen peroxide (a mixed solution of ammonia, water, and hydrogen peroxide) is used as an etchant and the conductive layer 108 is etched, so that the wirings 108a and 108b are formed.

Figure 9B:
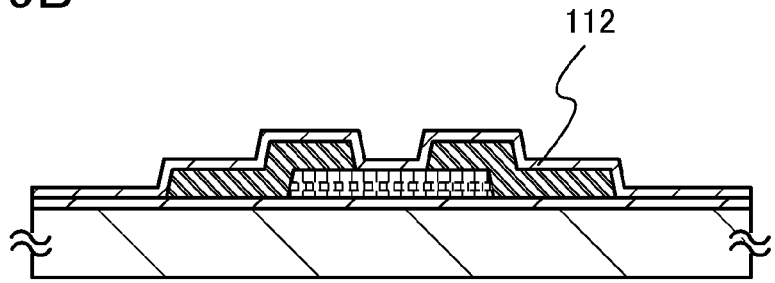

Next, as illustrated in FIG. 9B, a gate insulating layer 112 is formed over the insulating layer 101, the oxide semiconductor stack 110, and the wirings 108a and 108b, in a manner similar to that in Embodiment 1.

The i-type or substantially i-type oxide semiconductor layer (the highly purified oxide semiconductor layer whose hydrogen concentration is reduced) obtained by removal of impurities is extremely sensitive to an interface state and interface electric charge; therefore, the interface between the oxide semiconductor stack and the gate insulating layer 112 is important. Thus, the gate insulating layer 112 that is to be in contact with the highly purified oxide semiconductor stack 110 needs to have high quality.

For example, high-density plasma CVD using microwaves (e.g., with a frequency of 2.45 GHz) is preferably adopted because an insulating layer formed can be dense and have high withstand voltage and high quality. When the highly purified oxide semiconductor layer whose hydrogen concentration is reduced and the high-quality gate insulating layer are in close contact with each other, the interface state can be reduced and the interface characteristics can be favorable. In addition, since the insulating layer formed using high-density plasma CVD can have a uniform thickness, the insulating layer has excellent step coverage. Further, as for the insulating layer formed using high-density plasma CVD, the thickness can be controlled precisely.

It is needless to say that other film formation methods such as a sputtering method or a plasma CVD method can be employed as long as a high-quality insulating layer can be formed as the gate insulating layer. When a silicon oxide layer is formed by a sputtering method, a silicon target or a quartz target is used as a target, and oxygen or a mixed gas of oxygen and argon is used as a sputtering gas. In addition, as the gate insulating layer, an insulating layer whose characteristics of an interface with the oxide semiconductor stack 110 are improved or whose film quality is improved by heat treatment after the formation may be used. In any case, an insulating layer which can reduce the interface state density with the oxide semiconductor stack 110 and can form a favorable interface, in addition to having good film quality as the gate insulating layer, may be used.

For example, in a gate bias-temperature stress test (BT test) at 85° C. at $2 \times 10^6$ V/cm for 12 hours, when impurities are added to the oxide semiconductor stack 110, bonds between impurities and a main component of the oxide semiconductor stack 110 are cut by an intense electric field (B: bias) and high temperature (T: temperature), and generated dangling bonds cause a shift in threshold voltage (Vth).

On the other hand, when impurities in the oxide semiconductor stack 110, in particular, hydrogen, water, hydroxyl group, hydride, or the like, are removed as much as possible, and characteristics of an interface between the oxide semiconductor stack and the gate insulating layer are improved as described above, a transistor which is stable to the BT test can be obtained.

Note that a halogen element (e.g. fluorine or chlorine) may be contained in an insulating layer provided in contact with the oxide semiconductor stack 110, or a halogen element may be contained in the oxide semiconductor stack 110 by plasma treatment in a gas atmosphere containing a halogen element in a state that the oxide semiconductor stack 110 is exposed, whereby impurities such as hydrogen, water, hydroxyl group, or hydride existing in the oxide semiconductor stack 110 or at the interface between the oxide semiconductor stack 110 and the insulating layer which is provided in contact with the oxide semiconductor stack 110 may be removed. When the insulating layer is made to contain a halogen element, the halogen element concentration in the insulating layer may be approximately $5\times10^{17}$ cm$^{-3}$ to $1\times10^{20}$ cm$^{-3}$.

As described above, in the case where a halogen element is contained in the oxide semiconductor stack 110 or at the interface between the oxide semiconductor stack 110 and the insulating layer which is in contact with the oxide semiconductor stack 110 and the insulating layer which is provided in contact with the oxide semiconductor stack 110 is an oxide insulating layer, the side of the oxide insulating layer which is not in contact with the oxide semiconductor stack 110 is preferably covered with a nitride insulating layer. That is, a silicon nitride layer or the like may be provided on and in contact with the oxide insulating layer which is in contact with the oxide semiconductor stack 110. With such a structure, entry of an impurity such as hydrogen, water, hydroxyl group, or hydride into the oxide semiconductor stack 110 can be reduced.

Further, preheat treatment is preferably performed before the gate insulating layer 112 is formed in order to remove moisture or hydrogen which remains on the inner wall of the sputtering apparatus, on a surface of a target, or inside a target material. After the preheat treatment, the substrate or the sputtering apparatus is cooled. Then, the gate insulating layer 112 is formed without exposure to the air.

Figure 9C:
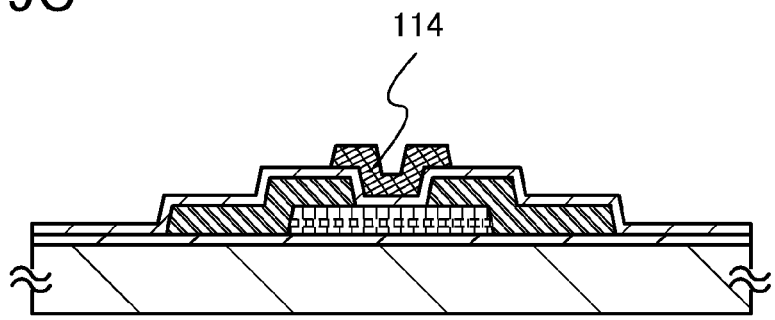

Next, a gate electrode 114 is formed over the gate insulating layer 112 in a region overlapping with the oxide semiconductor stack 110 (see FIG. 9C). The gate electrode 114 can be formed in such a way that a conductive layer is formed over the gate insulating layer 112 by a sputtering method, a CVD method, or a vacuum evaporation method, a resist mask is formed by a photolithography step over the conductive layer, and the conductive layer is etched using the resist mask.

Next, third heat treatment may be performed in an inert gas atmosphere or an oxygen gas atmosphere (preferably, at 200° C. to 450° C. inclusive, for example, 250° C. to 350° C. inclusive). By the heat treatment, oxygen is supplied to oxygen defects generated by the first and second heat treatment, so that it is possible to further reduce the oxygen defects which serve as donors, satisfy the stoichiometric proportion, and make the oxide semiconductor stack 110 closer to an i-type oxide semiconductor or a substantially i-type oxide semiconductor. Note that the third heat treatment may be performed before formation of the gate electrode 114 or after formation of an insulating layer 116 which is formed later.

Figure 9D:
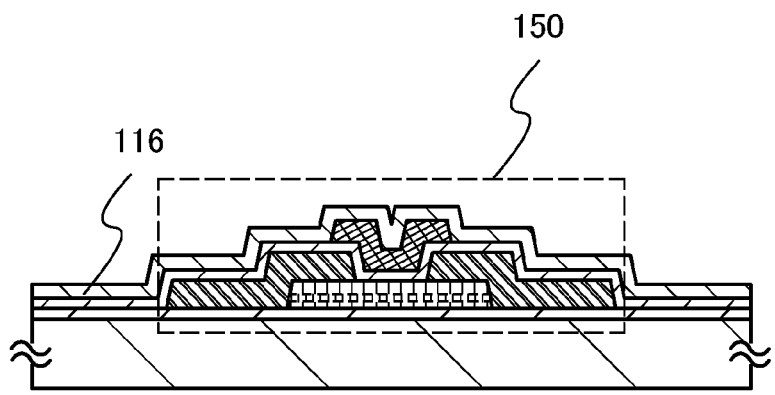

Next, the insulating layer 116 is formed over the gate insulating layer 112 and the gate electrode 114 (see FIG. 9D). The insulating layer 116 may contain hydrogen. The insulating layer 116 can be formed by a sputtering method, a CVD method, or the like. In this embodiment, a silicon nitride layer which is one of nitride insulating layers obtained by a CVD method is used.

The third heat treatment is performed in a nitrogen atmosphere at 150° C. to 450° C. inclusive, preferably 250° C. to 440° C. inclusive. In addition, the third heat treatment may be performed in an oxygen atmosphere, a rare gas atmosphere, or a dry air atmosphere without limitation to a nitrogen atmosphere.

Through the above process, a transistor 150 having the oxide semiconductor stack which is highly purified and has single crystal regions and in which the hydrogen concentration is reduced can be formed.

Figure 10A:
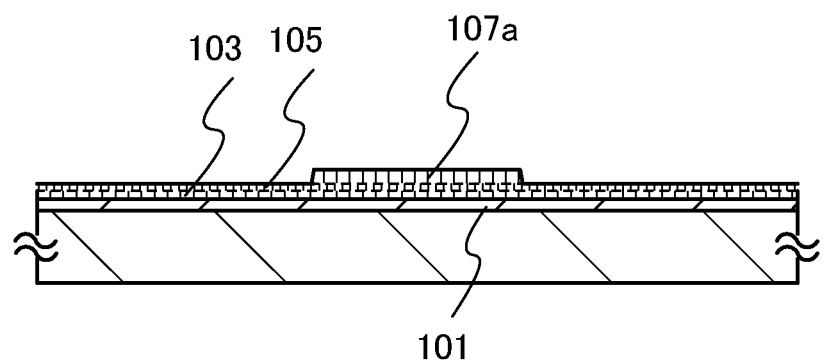
FIGS. 10A and 10B are cross-sectional views illustrating a process for manufacturing a semiconductor device according to an embodiment of the present invention.

After the step in FIG. 8C, in some cases, the second multi-component oxide semiconductor layer 107 including single crystal regions is etched into an island-shape but the single-component oxide semiconductor layer 105 including single crystal regions is not etched into an island-shape depending on the etching condition, and the first multi-component oxide semiconductor layer 103 including single crystal regions and the single-component oxide semiconductor layer 105 including single crystal regions remain over the entire surface of the insulating layer 101 as illustrated in FIG. 10A. This is because when the temperature of the first heat treatment is higher than that of the second heat treatment, a degree of crystallinity of the first multi-component oxide semiconductor layer 103 including single crystal regions and the single-component oxide semiconductor layer 105 including single crystal regions is higher than that of the second multi-component oxide semiconductor layer 107 including single crystal regions; therefore, the etching rate of the first multi-component oxide semiconductor layer 103 including single crystal regions and the single-component oxide semiconductor layer 105 including single crystal regions becomes low.

Figure 10B:
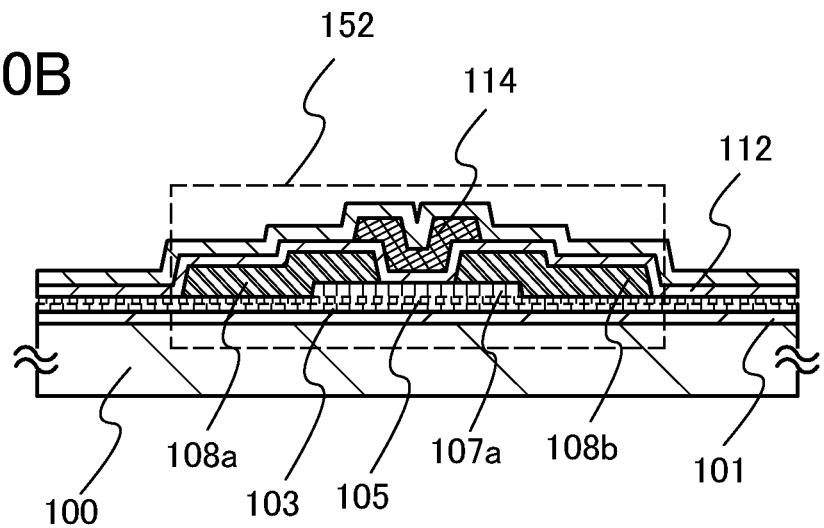

After that, through the steps illustrated in FIG. 8E and FIGS. 9A to 9D, a transistor 152 as illustrated in FIG. 10B is obtained, in which the first multi-component oxide semiconductor layer 103 including single crystal regions and the single-component oxide semiconductor layer 105 including single crystal regions are formed over the insulating layer 101, the island-shaped second multi-component oxide semiconductor layer 107a including single crystal regions, the wirings 108a and 108b, and the gate insulating layer 112 are formed over the single-component oxide semiconductor layer 105 including single crystal regions, and the gate electrode 114 is formed over the gate insulating layer 112.

A conventional oxide semiconductor is generally an n-type semiconductor and current tends to flow between source and drain electrodes even when gate voltage is 0 V in a transistor using a conventional oxide semiconductor; that is, the transistor tends to be normally on. In the case where the transistor is normally on, it is difficult to control a circuit even when the field-effect mobility is high. It is known that hydrogen can be a donor in an oxide semiconductor and is one factor causing an oxide semiconductor to be an n-type semiconductor. Further, an oxygen defect is known as one factor causing an oxide semiconductor to be an n-type semiconductor.

Therefore, in order to make the oxide semiconductor be an i-type oxide semiconductor, the oxide semiconductor is highly purified by removing hydrogen, water, hydroxyl group, hydride, or the like that is an n-type impurity along with the crystal growth in the first heat treatment and the second heat treatment so as to contain an impurity that is not a main component of the oxide semiconductor as little as possible and is made to be an intrinsic oxide semiconductor by removing oxygen defects in the third heat treatment. In other words, this embodiment has a feature that the oxide semiconductor is made to be a highly purified i-type (intrinsic) oxide semiconductor or an oxide semiconductor close thereto not by addition of an impurity but by removal of an impurity such as hydrogen, water, hydroxyl group, or hydride or oxygen defects as much as possible. In particular, since the oxide semiconductor described in this embodiment is crystallized to a high degree, it is characterized by having fewer impurities or defects than an amorphous, microcrystalline, or polycrystalline oxide semiconductor. By highly purifying the oxide semiconductor as described above, the threshold voltage of the transistor can be positive, so that a so-called normally-off switching element can be achieved.

The hydrogen concentration of the oxide semiconductor at this time is lower than or equal to $1 \times 10^{18}$ cm$^{-3}$, preferably lower than or equal to $1 \times 10^{16}$ cm$^{-3}$, more preferably substantially 0. Moreover, the carrier density of the oxide semiconductor is lower than $1 \times 10^{14}$ cm$^{-3}$, preferably lower than $1 \times 10^{12}$ cm$^{-3}$, more preferably lower than $1.45 \times 10^{10}$ cm$^{-3}$. That is, the carrier density of the oxide semiconductor is as close to zero as possible. Furthermore, the band gap of the oxide semiconductor is greater than or equal to 2 eV, preferably greater than or equal to 2.5 eV, more preferably greater than or equal to 3 eV. The hydrogen concentration in the oxide semiconductor is measured by secondary ion mass spectroscopy (SIMS). The carrier density can be measured by the Hall effect measurement. Lower carrier density can be calculated with the use of measurement results of capacitance-voltage (CV) measurement.

In the oxide semiconductor, the carrier density is sufficiently low (e.g., lower than $1 \times 10^{12}$/cm$^3$, preferably lower than $1.45 \times 10^{10}$/cm$^3$) as compared with the minimum carrier density (approximately $1 \times 10^{14}$/cm$^3$) of a general silicon wafer. Further, when drain voltage is in the range of 1 V to 10 V in a transistor with a channel length of 3 µm and a channel width of $1 \times 10^4$ µm, at room temperature, off-state current (current which flows between a source and a drain when the voltage between a gate and the source is lower than or equal to 0 V) can be lower than or equal to the lower limit of measurement and the subthreshold swing (S value) can be 0.1 V/dec (the thickness of the gate insulating layer: 100 nm). By highly purifying the oxide semiconductor as described above, off-state current can be reduced from $1 \times 10^{-20}$ A (10 zA (zeptoampere)) to about $1 \times 10^{-19}$ A (100 zA). Off-state current is made to flow by generation and recombination of electrons and holes through direct recombination or indirect recombination; however, since an oxide semiconductor has a wide band gap and a large amount of thermal energy is needed for electronic excitation, direct recombination and indirect recombination are less likely to occur. Thus, in the state where a negative potential is applied to the gate electrode (off state), since the number of holes that are minority carriers is substantially zero, direct recombination and indirect recombination are less likely to occur and the amount of current is extremely small.

Note that the resistance when the transistor is off (off-state resistance R) can be calculated using Ohm's law from the off-state current and the drain voltage, and the off-state resistivity ρ can be calculated using Formula, ρ=RA/L (R is the off-state resistance), from the cross-sectional area A of the channel formation region and the channel length L. The off-state resistivity is preferably higher than or equal to $1 \times 10^9$ Ω·m (or $1 \times 10^{10}$ Ω·m). Here, the cross-section area A can be obtained in accordance with the formula A=dW (d: the thickness of the channel formation region, W: the channel width).

Off-state current of a transistor including amorphous silicon is about $10^{-12}$ A, whereas off-state current of a transistor including an oxide semiconductor is much lower than $10^{-12}$ A. As described above, the transistor 150 with excellent off-state current characteristics can be obtained with the use of such an i-type or substantially i-type oxide semiconductor.

Furthermore, in a transistor, an oxide semiconductor is made to function as a path through which carriers flow by reducing or preferably eliminating carriers of the oxide semiconductor. Accordingly, the oxide semiconductor is an i-type (intrinsic) oxide semiconductor which is highly purified and includes extremely small number of or no carriers, and off-state current can be extremely small in the state where the transistor is in an off-state, which is the technical idea of this embodiment.

In addition, when the oxide semiconductor functions as a path and the oxide semiconductor itself is made to be an i-type (intrinsic) oxide semiconductor which is highly purified so as to include no carriers or extremely few carriers, carriers are supplied by source and drain electrodes. By appropriately selecting the electron affinity (χ) and the Fermi level which may ideally correspond to the intrinsic Fermi level of the oxide semiconductor, and the work function of the source and drain electrodes, carriers can be injected from the source and drain electrodes so that an n-channel transistor and a p-channel transistor can be manufactured as appropriate.

As described above, when the oxide semiconductor is highly purified so that impurities that are not main components of the oxide semiconductor, typically, hydrogen, water, hydroxyl group, or hydride, are contained as little as possible and is made to include single crystal regions, favorable operation of the transistor can be obtained. In particular, the on-off ratio can be improved. In addition, the amount of shift in threshold voltage of the transistor before and after the BT test can be suppressed, whereby high reliability can be obtained. Further, temperature dependence of electrical characteristics can be suppressed. Although any metal oxide which has been already reported is in an amorphous state or a polycrystalline state or can be in a single crystal state only by treatment at a temperature as high as around 1400° C., an oxide semiconductor layer including single crystal regions can be formed with the use of a large-area substrate at a relatively low temperature by the above-described method in which a single-component oxide semiconductor layer including flat-plate-shaped single crystal regions is formed and then crystal growth is carried out with the use of the single crystal regions as a seed crystal.

This embodiment can be implemented in appropriate combination with any of the structures described in other embodiments.

Embodiment 3

In this embodiment, a method for forming the oxide semiconductor stack 110 which is different from those in Embodiments 1 and 2 will be described with reference to FIGS. 11A to 11D.

Figure 11A:
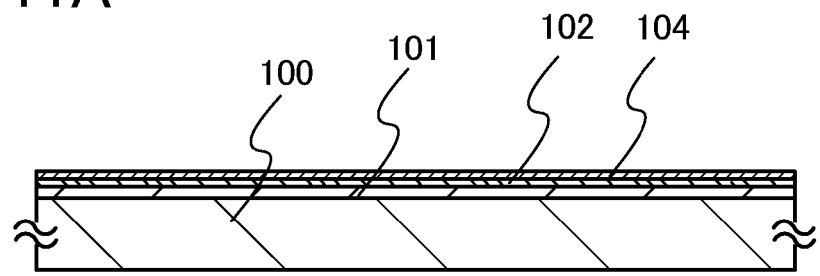
FIGS. 11A to 11D are cross-sectional views illustrating a process for manufacturing a semiconductor device according to an embodiment of the present invention.

In a manner similar to that in Embodiment 2, an insulating layer 101 is formed over a substrate 100 as illustrated in FIG. 11A. Next, a first multi-component oxide semiconductor layer 102 is formed over the insulating layer 101, and a single-component oxide semiconductor layer 104 is formed over the first multi-component oxide semiconductor layer 102.

Figure 11B:
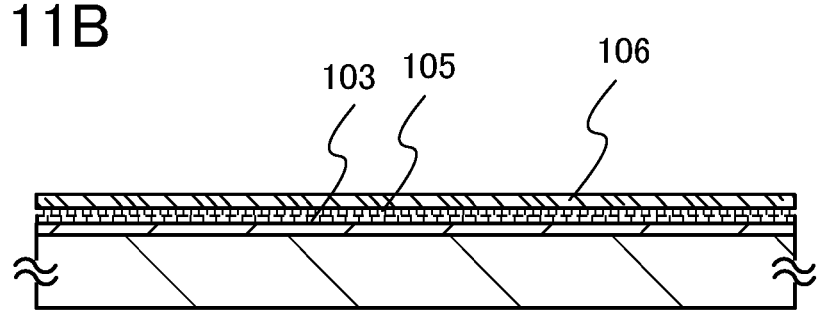
Figure 11C:
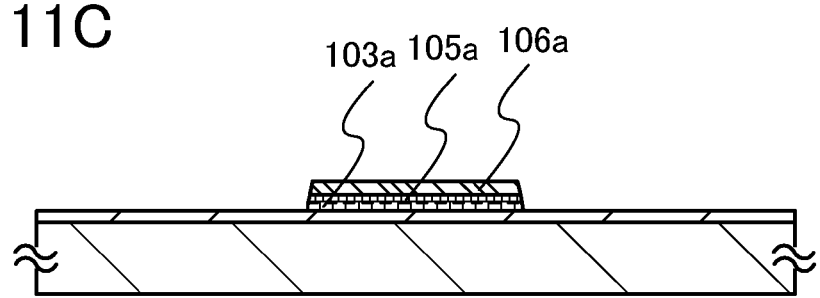
Figure 11D:
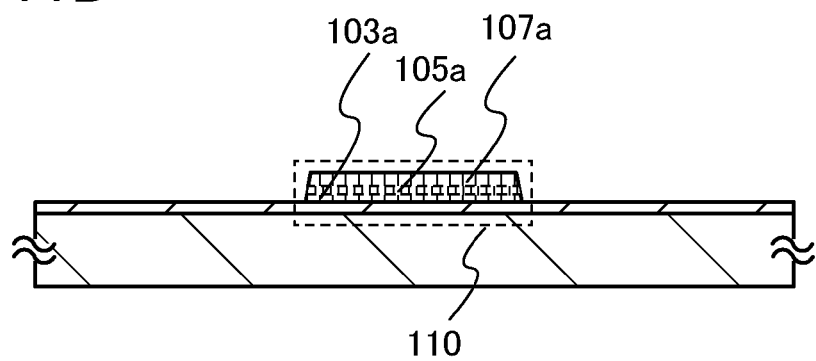

Then, in a manner similar to that in Embodiment 1, first heat treatment is performed, so that a first multi-component oxide semiconductor layer 103 including single crystal regions and a single-component oxide semiconductor layer 105 including single crystal regions are formed as illustrated in FIG. 11B. After that, a second multi-component oxide semiconductor layer 106 is formed over the single-component oxide semiconductor layer 105 including single crystal regions.

Next, a resist mask is formed over the second multi-component oxide semiconductor layer 106 by a photolithography step, and the first multi-component oxide semiconductor layer 103 including single crystal regions, the single-component oxide semiconductor layer 105 including single crystal regions, and the second multi-component oxide semiconductor layer 106 are etched with the use of the resist mask, whereby an island-shaped first multi-component oxide semiconductor layer 103*a* including a singe crystal region, an island-shaped single-component oxide semiconductor layer 105*a* including single crystal regions, and an island-shaped multi-component oxide semiconductor layer 106*a* are formed. After that, the resist mask is removed (see FIG. 11C).

Then, through second heat treatment, crystal growth of the second multi-component oxide semiconductor layer 106*a* is carried out using the single-component oxide semiconductor layer 105*a* including single crystal regions as a seed crystal, whereby a second multi-component oxide semiconductor layer 107*a* including single crystal regions is formed. Through the above steps, an oxide semiconductor stack 110 which has the first multi-component oxide semiconductor layer 103*a* including single crystal regions, the single-component oxide semiconductor layer 105*a* including single crystal regions, and the second multi-component oxide semiconductor layer 107*a* including single crystal regions can be formed. After that, through the steps illustrated in FIG. 8E and FIGS. 9A to 9D, a transistor 150 as illustrated in FIG. 1 can be formed.

The second multi-component oxide semiconductor layer including single crystal regions has a high degree of crystallinity; thus, depending on the etching condition, the etching rate of the second multi-component oxide semiconductor layer including single crystal regions is lower than that of the second multi-component oxide semiconductor layer before being crystallized. Accordingly, by etching the second multi-component oxide semiconductor layer into an island-shape before the second heat treatment, etching time can be shortened.

This embodiment can be implemented in appropriate combination with any of the structures described in other embodiments.

Embodiment 4

In this embodiment, a method for forming the oxide semiconductor stack 110 which is different from those in Embodiments 1 to 3 will be described with reference to FIGS. 12A to 12D.

In a manner similar to that in Embodiment 2, an insulating layer 101 is formed over a substrate 100. Next, a first multi-component oxide semiconductor layer is formed over the insulating layer 101, and a single-component oxide semiconductor layer is formed over the first multi-component oxide semiconductor layer. Then, in a manner similar to that in Embodiment 1, first heat treatment is performed, so that a first multi-component oxide semiconductor layer 103 including single crystal regions and a single-component oxide semiconductor layer 105 including single crystal regions are formed (see FIG. 12A).

Figure 12A:
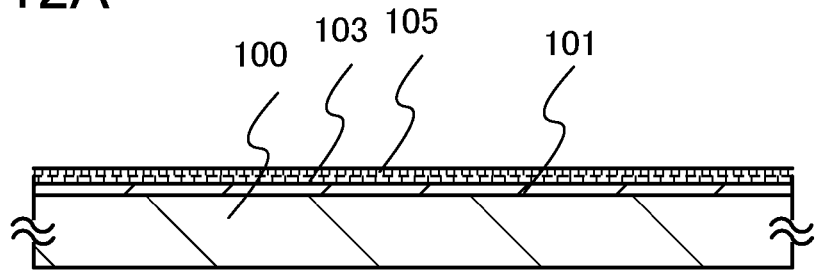
FIGS. 12A to 12D are cross-sectional views illustrating a process for manufacturing a semiconductor device according to an embodiment of the present invention.
Figure 12B:
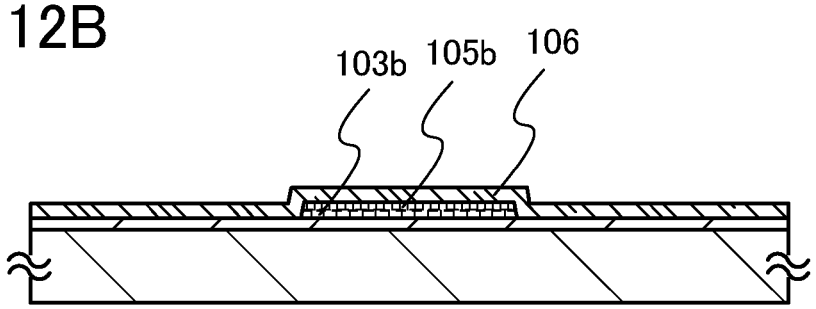
Figure 12C:
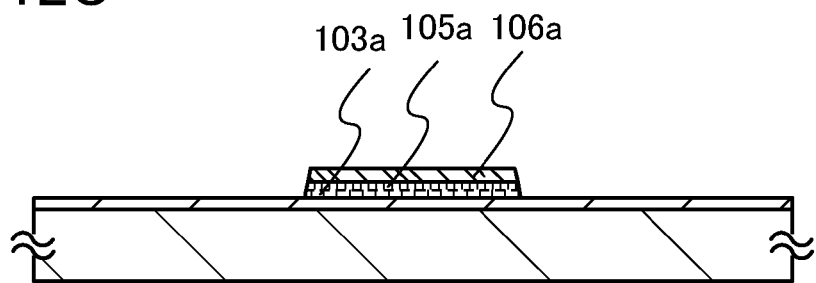
Figure 12D:
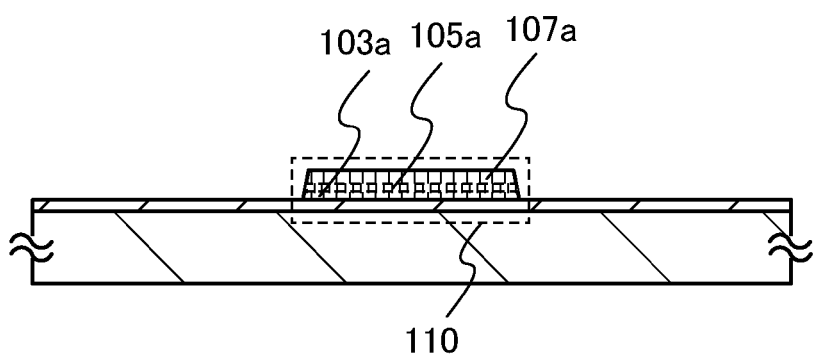

Next, a resist mask is formed over the single-component oxide semiconductor layer 105 including single crystal regions by a photolithography step, and the first multi-component oxide semiconductor layer 103 including single crystal regions and the single-component oxide semiconductor layer 105 including single crystal regions are etched with the use of the resist mask, whereby an island-shaped first multi-component oxide semiconductor layer 103*b* including single crystal regions and an island-shaped single-component oxide semiconductor layer 105*b* including single crystal regions are formed as illustrated in FIG. 12B. Then, the resist mask is removed.

After that, a second multi-component oxide semiconductor layer 106 is formed over the single-component oxide semiconductor layer 105*b* including single crystal regions and the insulating layer 101.

Next, a resist mask is formed over the second multi-component oxide semiconductor layer 106 by a photolithography step, and the first multi-component oxide semiconductor layer 103*b* including single crystal regions, the single-component oxide semiconductor layer 105*b* including single crystal regions, and the second multi-component oxide semiconductor layer 106 are etched with the use of the resist mask, whereby an island-shaped first multi-component oxide semiconductor layer 103*a* including single crystal regions, an island-shaped single-component oxide semiconductor layer 105*a* including single crystal regions, and an island-shaped second multi-component oxide semiconductor layer 106*a* are formed. After that, the resist mask is removed (see FIG. 12C).

Then, through second heat treatment, crystal growth of the second multi-component oxide semiconductor layer 106*a* is carried out using the single-component oxide semiconductor layer 105*a* including single crystal regions as a seed crystal, whereby a second multi-component oxide semiconductor layer 107*a* including single crystal regions is formed. Through the above steps, an oxide semiconductor stack 110 which has the first multi-component oxide semiconductor layer 103*a* including single crystal regions, the single-component oxide semiconductor layer 105*a* including single crystal regions, and the second multi-component oxide semiconductor layer 107*a* including single crystal regions can be formed (see FIG. 12D). After that, through the steps illustrated in FIG. 8E and FIGS. 9A to 9D, a transistor 150 as illustrated in FIG. 1 can be formed.

The second multi-component oxide semiconductor layer including single crystal regions has a high degree of crystallinity; thus, depending on the etching condition, the etching rate of the second multi-component oxide semiconductor layer including single crystal regions is lower than that of the second multi-component oxide semiconductor layer before being crystallized. Accordingly, by etching the second multi-component oxide semiconductor layer into an island-shape before the second heat treatment, etching time can be shortened.

This embodiment can be implemented in appropriate combination with any of the structures described in other embodiments.

Embodiment 5

In this embodiment, a mode in which a method for forming the second multi-component oxide semiconductor layer including single crystal regions is different from that in Embodiment 1 will be described with reference to FIGS. 8A to 8E and FIGS. 13A and 13B.

In a manner similar to that in Embodiment 2, an insulating layer 101 is formed over a substrate 100 as illustrated in FIG. 8A. Next, a first multi-component oxide semiconductor layer 102 is formed over the insulating layer 101, and a single-component oxide semiconductor layer 104 is formed over the first multi-component oxide semiconductor layer 102.

Figure 13A:
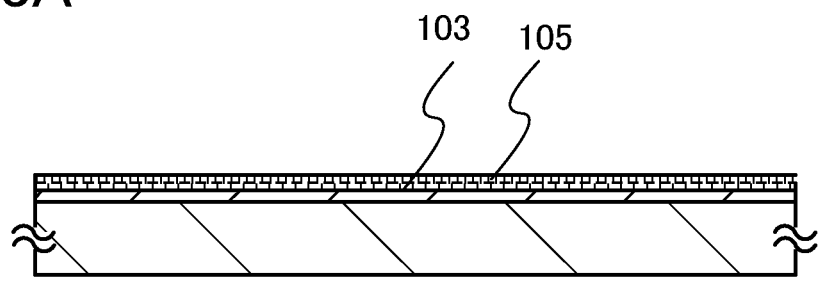
FIGS. 13A and 13B are cross-sectional views illustrating a process for manufacturing a semiconductor device according to an embodiment of the present invention.

Then, in a manner similar to that in Embodiment 1, first heat treatment is performed, so that a first multi-component oxide semiconductor layer 103 including single crystal regions and a single-component oxide semiconductor layer 105 including single crystal regions are formed as illustrated in FIG. 13A.

Figure 13B:
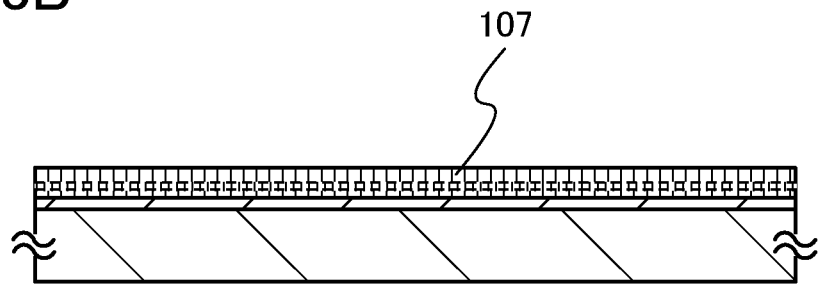

Next, as illustrated in FIG. 13B, a second multi-component oxide semiconductor layer 107 including single crystal regions is formed over the single-component oxide semiconductor layer 105 including single crystal regions by a sputtering method while heating is performed at 200° C. to 600° C. inclusive, preferably 200° C. to 550° C. inclusive. The second multi-component oxide semiconductor layer 107 including single crystal regions has a non-wurtzite crystal structure that is a hexagonal crystal structure. Here, the second multi-component oxide semiconductor layer is deposited while heating is performed. Since crystal growth (also referred to as epitaxial growth or axial growth) proceeds with the use of single crystal regions at the surface of the single-component oxide semiconductor layer 105 including single crystal regions as a seed crystal, the second multi-component oxide semiconductor layer 107 including single crystal regions can be formed so as to have the same crystal axis, particularly, the same c-axis direction as the single-component oxide semiconductor layer 105 including single crystal regions. As a result, without second heat treatment, the crystallized second multi-component oxide semiconductor layer 107 including single crystal regions which has the same c-axis direction as the single-component oxide semiconductor layer 105 including single crystal regions can be formed.

After that, through the steps described in Embodiment 1, a transistor 150 can be manufactured.

In this embodiment, the number of times of heat treatment can be reduced, whereby throughput can be increased.

This embodiment can be implemented in appropriate combination with any of the structures described in other embodiments.

Embodiment 6

Although a process for manufacturing a top-gate transistor is described in Embodiments 1 to 5, a process for manufacturing a bottom-gate transistor will be described in this embodiment with reference to FIGS. 14A to 14E.

In this embodiment, a glass substrate is used as a substrate 100, and heat treatment at 650° C. for 6 minutes is performed twice on the substrate 100 in advance. By heating the substrate before the formation of a transistor, film peeling due to shrink of the substrate or misalignment of a mask can be suppressed. Next, a conductive layer is formed over the substrate 100 which has an insulating surface, and then, a gate electrode 400 is provided by a photolithography step with the use of a photomask.

Further, the insulating layer 101 described in Embodiment 2 may be provided between the substrate 100 and the gate electrode 400. With the insulating layer 101, adhesion between the substrate 100 and the gate electrode 400 can be increased.

The material and manufacturing method of the gate electrode 114 described in Embodiment 1 can be employed as appropriate for the gate electrode 400. The end portion of the gate electrode 400 preferably has a tapered shape because coverage with an insulating layer, a semiconductor layer, and a conductive layer which are formed later can be improved.

Then, a gate insulating layer 401 is formed over the gate electrode 400. For the gate insulating layer 401, the material and manufacturing method of the gate insulating layer 112 described in Embodiment 1 can be used as appropriate.

Figure 14A:
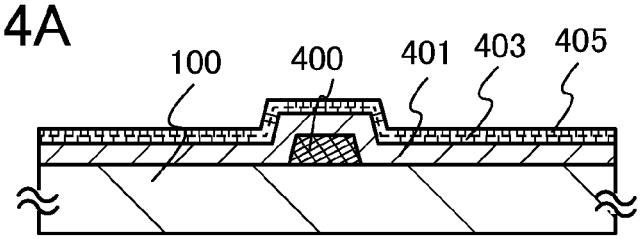
FIGS. 14A to 14E are cross-sectional views illustrating a process for manufacturing a semiconductor device according to an embodiment of the present invention.

Next, in a manner similar to that in Embodiment 1, after a first multi-component oxide semiconductor layer is formed over the gate insulating layer 401 and a single-component oxide semiconductor layer is formed over the first multi-component oxide semiconductor layer, first heat treatment is performed, so that a first multi-component oxide semiconductor layer 403 including single crystal regions and a single-component oxide semiconductor layer 405 including single crystal regions are formed (see FIG. 14A).

Figure 14B:
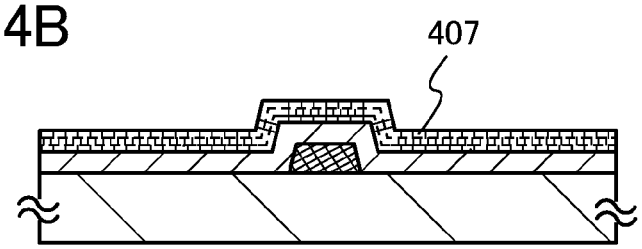

Then, after a second multi-component oxide semiconductor layer is formed over the single-component oxide semiconductor layer 405 including single crystal regions in a manner similar to that in Embodiment 1, second heat treatment is performed, so that a second multi-component oxide semiconductor layer 407 including single crystal regions is formed (see FIG. 14B).

After a resist mask is formed over the second multi-component oxide semiconductor layer 407 including single crystal regions by a photolithography step, etching is performed, so that an island-shaped first multi-component oxide semiconductor layer 403a including single crystal regions, an island-shaped single-component oxide semiconductor layer 405a including single crystal regions, and an island-shaped second multi-component oxide semiconductor layer 407a including single crystal regions are formed.

Wirings 408a and 408b functioning as a source electrode and a drain electrode are formed over the gate insulating layer 401, the island-shaped first multi-component oxide semiconductor layer 403a including single crystal regions, the island-shaped single-component oxide semiconductor layer 405a including single crystal regions, and the island-shaped second multi-component oxide semiconductor layer 407a including single crystal regions. The wirings 408a and 408b can be formed in a manner similar to that of the wirings 108a and 108b described in Embodiment 1.

Figure 14C:
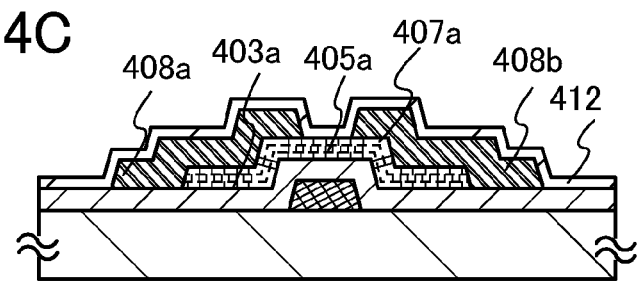
Figure 14D:
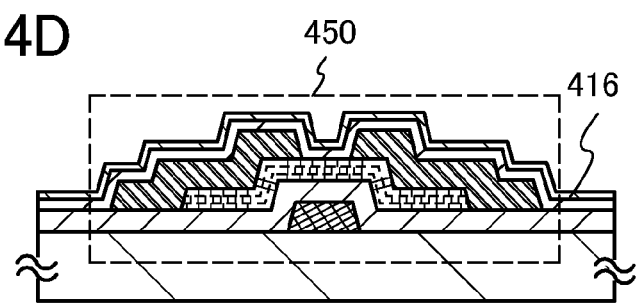

Next, after an oxide insulating layer 412 serving as a protective insulating layer is formed in contact with part of the oxide semiconductor layer, third heat treatment may be performed (see FIG. 14C).

In this embodiment, a 300-nm-thick silicon oxide layer is formed as the oxide insulating layer 412 by a sputtering method. The substrate temperature at the formation may be room temperature to 300° C. inclusive and is 100° C. in this embodiment. The silicon oxide layer can be formed by a sputtering method in a rare gas (typically argon) atmosphere, an oxygen atmosphere, or a mixed atmosphere containing a rare gas (typically argon) and oxygen. As a target, a silicon oxide target or a silicon target can be used. For example, with the use of a silicon target, the silicon oxide layer can be formed by a sputtering method in an atmosphere containing oxygen and nitrogen. The oxide insulating layer 412 which is formed in contact with the crystallized island-shaped first multi-component oxide semiconductor layer 403a including single crystal regions, the crystallized island-shaped single-component oxide semiconductor layer 405a including single crystal regions and the crystallized island-shaped second multi-component oxide semiconductor layer 407a including single crystal regions has a thickness of 10 nm to 500 nm inclusive and is typically formed using a silicon oxide layer, a silicon nitride oxide layer, an aluminum oxide layer, an aluminum oxynitride layer, or the like.

In addition, the temperature of the third heat treatment is set in the range of 200° C. to 450° C. inclusive, preferably 250° C. to 350° C. inclusive. By the heat treatment, oxygen is supplied to oxygen defects generated by the first heat treatment and the second heat treatment, so that it is possible to further reduce the oxygen defects which serve as donors, satisfy the stoichiometric proportion, and make the first multi-component oxide semiconductor layer 403a including single crystal regions, the single-component oxide semiconductor layer 405a including single crystal regions, and the second multi-component oxide semiconductor layer 407a including single crystal regions closer to i-type oxide semiconductor layers or substantially i-type oxide semiconductor layers.

Next, an insulating layer 416 is formed over the oxide insulating layer 412. After that, fourth heat treatment may be performed (see FIG. 14D). The insulating layer 416 can be formed in a manner similar to that of the insulating layer 116 described in Embodiment 2.

The fourth heat treatment is performed in a nitrogen atmosphere at 150° C. to 450° C. inclusive, preferably 250° C. to 440° C. inclusive. In addition, the fourth heat treatment may be performed in an oxygen atmosphere, a rare gas atmosphere, or a dry air atmosphere without limitation to the nitrogen atmosphere.

Through the above steps, a transistor 450 including the first multi-component oxide semiconductor layer 403a including single crystal regions and the second multi-component oxide semiconductor layer 407a including single crystal regions, which are obtained by crystal growth from a crystal region of the single-component oxide semiconductor layer 405a including single crystal regions, is completed.

Figure 14E:
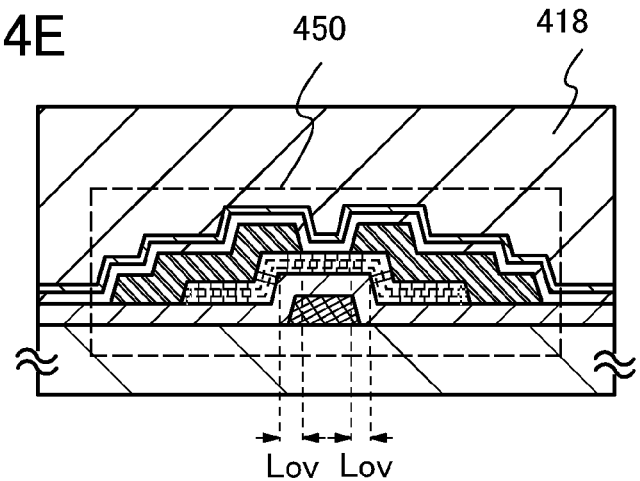

Next, an interlayer insulating layer 418 may be formed over the insulating layer 416 (see FIG. 14E). The interlayer insulating layer 418 is formed using a material containing an inorganic insulating material, e.g., a silicon oxide layer, a silicon nitride oxide layer, a silicon nitride layer, a hafnium oxide layer, an aluminum oxide layer, or a tantalum oxide layer which is obtained by a sputtering method, a CVD method, or the like. Alternatively, an organic resin such as acrylic, polyimide, or an epoxy resin can be used for the material of the interlayer insulating layer 418. Note that a stacked structure including the oxide insulating layer 412, the insulating layer 416, and the interlayer insulating layer 418 is used in this embodiment, but an embodiment of the invention disclosed herein is not limited to this example. A single-layer or a stacked structure including two layers or four or more layers may be used.

Further, one feature of the transistor described in this embodiment is that, as illustrated in FIG. 14E, the gate electrode 400 includes regions overlapping with the wirings 408a and 408b. The gate electrode 400 includes a region between an end portion of the wiring 408a and a step of the gate insulating layer 401, in other words, a region between the end portion of the wiring 408a and a point in the gate insulating layer at which a flat surface is changed to a tapered surface in the cross-sectional view (here, a $L_{OV}$ region in FIG. 14E). The $L_{OV}$ region is important in view of preventing carriers from flowing to a crystal grain boundary of the oxide semiconductor which is generated due to the step of the end portion of the gate electrode.

Figure 15A:
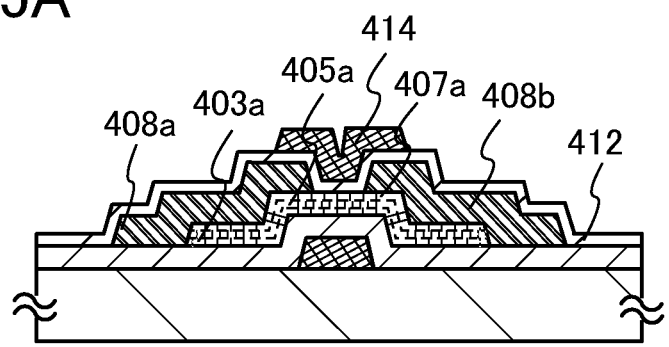
FIGS. 15A and 15B are cross-sectional views illustrating a process for manufacturing a semiconductor device according to an embodiment of the present invention.
Figure 15B:
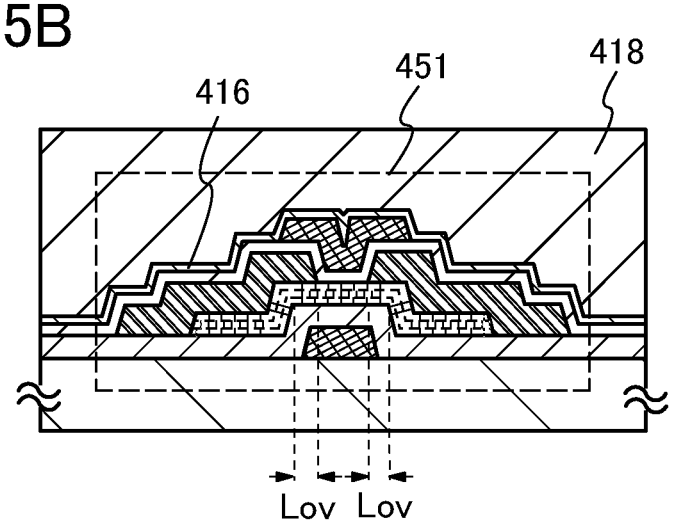

Furthermore, a back gate electrode may be formed over the oxide insulating layer 412. FIGS. 15A and 15B illustrate a manufacturing process in such a case. After the state of FIG. 14C is obtained, a contact hole reaching the gate electrode 400 is formed and a back gate electrode 414 is formed over the oxide insulating layer 412 (see FIG. 15A). Then, after an insulating layer 416 is formed over the back gate electrode 414 and the oxide insulating layer 412, fourth heat treatment may be performed. Through the above steps, a transistor 451 illustrated in FIG. 15B can be formed. When the back gate electrode 414 is provided at the position overlapping with a channel formation region formed in the first multi-component oxide semiconductor layer including single crystal regions, the single-component oxide semiconductor layer including single crystal regions, and the second multi-component oxide semiconductor layer including single crystal regions, the back gate electrode functions as a passivation layer and can prevent entry of hydrogen into the channel formation region from the outside, so that the amount of change in threshold voltage of the transistor 451 before and after a BT test (bias-temperature stress test) can be reduced.

The back gate electrode 414 may have a potential different from that of the gate electrode 400 of the transistor 451. In addition, the potential of the back gate electrode 414 may be GND or 0 V, or the back gate electrode 414 may be in a floating state. In such a case, the contact hole which reaches the gate electrode 400 is not formed before the formation of the back gate electrode 414, whereby the potentials of the gate electrode 400 and the back gate electrode 414 can be different from each other.

Next, an interlayer insulating layer 418 for planarization is formed over the insulating layer 416, so that a cross-sectional structure illustrated in FIG. 15B can be obtained.

This embodiment can be implemented in appropriate combination with any of the structures described in other embodiments.

Embodiment 7

In this embodiment, a structure of a channel-stop transistor will be described with reference to FIG. 16.

Since this embodiment is only partly different from Embodiment 6, detailed description is omitted here.

A process will be described below. In a manner similar to that in Embodiment 6, a gate electrode 400 and a gate insulating layer 402 are formed over a substrate 100. Next, in a manner similar to that in Embodiment 6, a first multi-component oxide semiconductor layer is formed over the gate insulating layer 402, a single-component oxide semiconductor layer is formed over the first multi-component oxide semiconductor layer, and first heat treatment is performed to crystallize the first multi-component oxide semiconductor layer and the single-component oxide semiconductor layer, whereby a first multi-component oxide semiconductor layer including single crystal regions and a single-component oxide semiconductor layer including single crystal regions are formed. Then, in a manner similar to that in Embodiment 6, a second multi-component oxide semiconductor layer is formed, and second heat treatment is performed to crystallize the second multi-component oxide semiconductor layer, whereby a second multi-component oxide semiconductor layer including single crystal regions is formed.

Next, an oxide insulating layer is formed and third heat treatment is performed. The oxide insulating layer is formed using the same material as the oxide insulating layer 412 described in Embodiment 6. In addition, the conditions of the third heat treatment are the same as the third heat treatment described in Embodiment 6, and oxygen is supplied to the first multi-component oxide semiconductor layer including single crystal regions, the single-component oxide semiconductor layer including single crystal regions, and the second multi-component oxide semiconductor layer including single crystal regions to reduce oxygen defects in the first multi-component oxide semiconductor layer including single crystal regions, the single-component oxide semiconductor layer including single crystal regions, and the second multi-component oxide semiconductor layer including single crystal regions.

Next, by a photolithography step, a resist mask is formed over the oxide insulating layer and selective etching is performed to form an island-shaped first multi-component oxide semiconductor layer 403a including single crystal regions, an island-shaped single-component oxide semiconductor layer 405a including single crystal regions, and an island-shaped second multi-component oxide semiconductor layer 407a including single crystal regions. At this time, the oxide insulating layer is also etched.

Next, the resist mask is removed, and by a photolithography, a resist mask is formed and selective etching is performed to form an island-shaped oxide insulating layer 420.

Then, wirings 408a and 408b are formed over the island-shaped oxide insulating layer 420, the island-shaped first multi-component oxide semiconductor layer 403a including single crystal regions, the island-shaped single-component oxide semiconductor layer 405a including single crystal regions, and the island-shaped second multi-component oxide semiconductor layer 407a including single crystal regions in a manner similar to that in Embodiment 1.

Next, an insulating layer 416 is formed over the wirings 408a and 408b and the island-shaped oxide insulating layer 420. After that, fourth heat treatment may be performed. The conditions of the fourth heat treatment may be the same as the fourth heat treatment described in Embodiment 6.

Through the above steps, a channel-stop transistor 452 including the first multi-component oxide semiconductor layer including single crystal regions, the single-component oxide semiconductor layer including single crystal regions, and the second multi-component oxide semiconductor layer including single crystal regions is completed.

Figure 16:
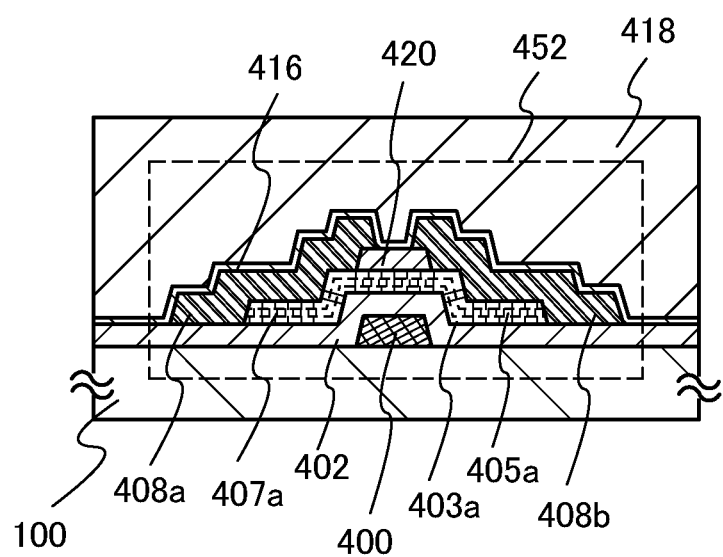
FIG. 16 is a cross-sectional view illustrating a process for manufacturing a semiconductor device according to an embodiment of the present invention.

Next, an interlayer insulating layer 418 for planarization is formed over the insulating layer 416, so that a cross-sectional structure illustrated in FIG. 16 can be obtained.

This embodiment can be implemented in appropriate combination with any of the structures described in other embodiments.

Embodiment 8

Figure 17:
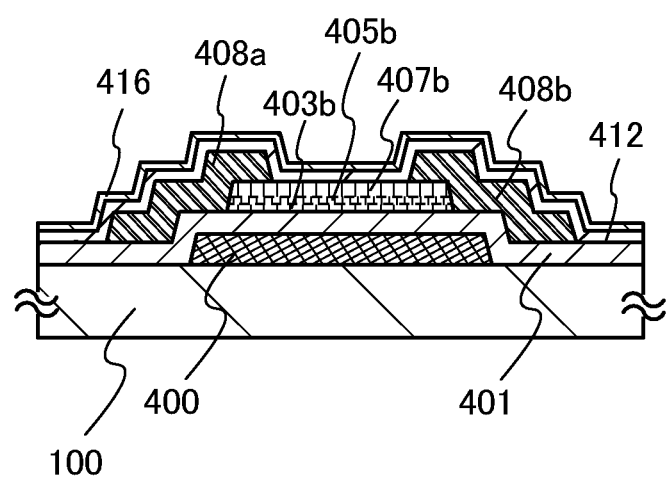
FIG. 17 is a cross-sectional view illustrating a semiconductor device according to an embodiment of the present invention.

In this embodiment, a structure applicable to Embodiments 6 and 7 will be described with reference to FIG. 17.

In this embodiment, a first multi-component oxide semiconductor layer 403b including single crystal regions, a single-component oxide semiconductor layer 405b including single crystal regions, and a second multi-component oxide semiconductor layer 407b including single crystal regions each have a smaller area than that of a gate electrode 400 and overlap with the gate electrode 400 entirely. Therefore, when the gate electrode 400 is formed using a metal element or an alloy having a light-blocking property, light which comes from the outside through the substrate 100 and is emitted to the first multi-component oxide semiconductor layer 403b including single crystal regions, the single-component oxide semiconductor layer 405b including single crystal regions, and the second multi-component oxide semiconductor layer 407b including single crystal regions can be reduced. In addition, the first multi-component oxide semiconductor layer 403b including single crystal regions, the single-component oxide semiconductor layer 405b including single crystal regions, and the second multi-component oxide semiconductor layer 407b including single crystal regions overlap with only a flat portion of the gate electrode 400 which does not include an end portion and thus have a flat shape. Accordingly, all the c-axis directions which are perpendicular to the surface are parallel to each other, so that a crystal grain boundary is unlikely to be formed and a single crystal structure with a high degree of crystallinity can be substantially obtained.

Through the above steps, a transistor including a first multi-component oxide semiconductor layer, a single-component oxide semiconductor layer, and a second multi-component oxide semiconductor layer which substantially have a single crystal structure can be obtained.

This embodiment can be implemented in appropriate combination with any of the structures described in other embodiments.

Embodiment 9

In this embodiment, as an example of the case where the semiconductor device described in any of the above embodiments is used for a semiconductor integrated circuit, a semiconductor device having a stacked structure with a semiconductor device using another semiconductor material will be described with reference to FIG. 18.

Figure 18:
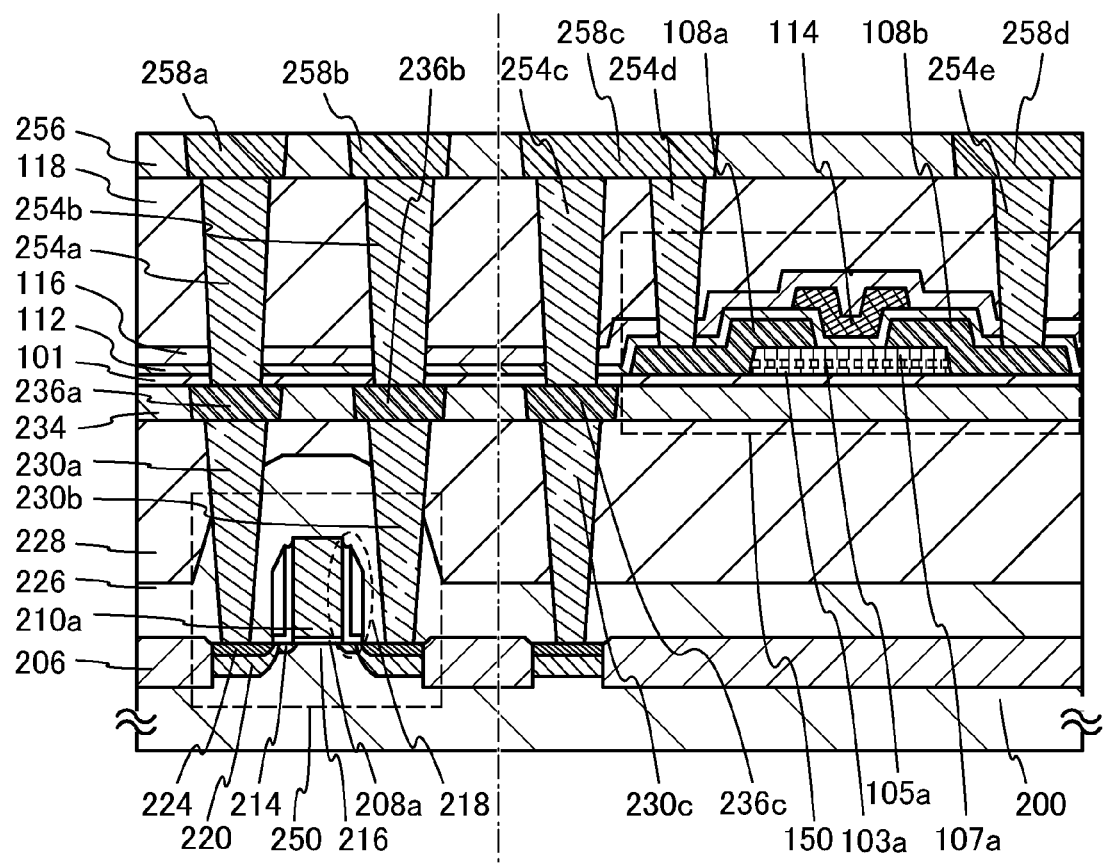
FIG. 18 is a cross-sectional view illustrating a semiconductor device according to an embodiment of the present invention.

FIG. 18 is a cross-sectional view illustrating an embodiment of a structure of a semiconductor device according to this embodiment. The semiconductor device illustrated in FIG. 18 includes a transistor 250 in which a material other than an oxide semiconductor (e.g., silicon) is used in a lower portion and a transistor 150 in which an oxide semiconductor is used in an upper portion. The transistor 150 in which an oxide semiconductor is used is the transistor 150 illustrated in FIG. 1. Although the transistors 250 and 150 are n-channel transistors here, p-channel transistors may be used. In particular, it is easy to use a p-channel transistor as the transistor 250.

The transistor 250 includes a channel formation region 216 which is provided in a substrate 200 containing a semiconductor material; impurity regions 214 between which the channel formation region 216 is sandwiched and high-concentration impurity regions 220 between which the channel formation region 216 is sandwiched (which are also collectively called impurity regions); a gate insulating layer 208a provided over the channel formation region 216; a gate electrode 210a provided over the gate insulating layer 208a; and wirings 230a and 230b which function as a source electrode and a drain electrode and are electrically connected to the impurity regions 214 (see FIG. 18).

Here, a sidewall insulating layer 218 is provided on a side surface of the gate electrode 210a. The high-concentration impurity regions 220 are provided in regions of the substrate 200 which do not overlap with the sidewall insulating layer 218 when seen from a direction perpendicular to a main surface of the substrate 200, and metal compound regions 224 in contact with the high-concentration impurity regions 220 are provided. An element isolation insulating layer 206 is provided on the substrate 200 so as to surround the transistor 250. An interlayer insulating layer 226 and an interlayer insulating layer 228 are provided so as to cover the transistor 250. The wirings 230a and 230b are electrically connected to the metal compound regions 224 through openings formed in the interlayer insulating layers 226 and 228 and an insulating layer 234. In other words, the wirings 230a and 230b are electrically connected to the high-concentration impurity regions 220 and the impurity regions 214 through the metal compound regions 224.

The transistor 150 includes a first multi-component oxide semiconductor layer 103a including single crystal regions, a single-component oxide semiconductor layer 105a including single crystal regions, and a second multi-component oxide semiconductor layer 107a including single crystal regions which are provided over an insulating layer 101; wirings 108a and 108b which are provided over and electrically connected to the first multi-component oxide semiconductor layer 103a including single crystal regions, the single-component oxide semiconductor layer 105a including single crystal regions, and the second multi-component oxide semiconductor layer 107a including single crystal regions and function as a source electrode and a drain electrode; a gate insulating layer 112 provided so as to cover the first multi-component oxide semiconductor layer 103a including single crystal regions, the single-component oxide semiconductor layer 105a including single crystal regions, the second multi-component oxide semiconductor layer 107a including single crystal regions, and the wirings 108a and 108b; and a gate electrode 114 provided over the gate insulating layer 112 in a region overlapping with the second multi-component oxide semiconductor layer 107a including single crystal regions.

In addition, an insulating layer 116 and an interlayer insulating layer 118 are provided over the transistor 150. Here, openings reaching the wirings 108a and 108b are provided in the gate insulating layer 112, the insulating layer 116, and the interlayer insulating layer 118. Through the openings, a wiring 254d and a wiring 254e are formed in contact with the wiring 108a and the wiring 108b, respectively. In a manner similar to that of the wirings 254d and 254e, a wiring 254a, a wiring 254b, and a wiring 254c are formed in contact with a wiring 236a, a wiring 236b, and a wiring 236c, respectively, through openings provided in the gate insulating layer 112, the insulating layer 116, and the interlayer insulating layer 118.

In addition, an insulating layer 256 is provided over the interlayer insulating layer 118. A wiring 258a, a wiring 258b, a wiring 258c, and a wiring 258d are provided so as to be embedded in the insulating layer 256. Here, the wiring 258a is in contact with the wiring 254a; the wiring 258b is in contact with the wiring 254b; the wiring 258c is in contact with the wiring 254c and the wiring 254d; and the wiring 258d is in contact with the wiring 254e.

In other words, the wiring 108a of the transistor 150 is electrically connected to another element (such as the transistor in which a material other than an oxide semiconductor is used) through a wiring 230c, the wiring 236c, the wiring 254c, the wiring 258c, and the wiring 254d. In addition, the wiring 108b of the transistor 150 is electrically connected to another element through the wiring 254e and the wiring 258d. Note that the structure of the wirings for connection (such as the wiring 230c, the wiring 236c, the wiring 254c, the wiring 258c, and the wiring 254d) is not limited to the above structure, and appropriate addition, omission, or the like is possible.

Note that for part of the wirings (e.g., the wiring 258a, the wiring 258b, the wiring 258c, and the wiring 258d), a material containing copper is preferably used. When a material containing copper is used for part of them, conductivity can be improved. An electrode or a wiring containing copper can be formed by a so-called damascene process or the like.

As described above, in this embodiment, a typical embodiment of the semiconductor device having a stacked structure is described; however, an embodiment of the invention disclosed herein is not limited thereto. For example, a structure of a transistor, the number of insulating layers and arrangement thereof, the number of electrodes and wirings and a connection relation therebetween, and the like can be changed as appropriate. As an example of a connection relation between electrodes, a structure can be employed in which the gate electrode 210a of the transistor 250 and the wiring 108a or 108b of the transistor 150 are electrically connected to each other.

With a combination of a transistor in which a material other than an oxide semiconductor is used and a transistor in which an oxide semiconductor is used, a semiconductor device having electric characteristics different from those of the transistor in which an oxide semiconductor is used can be achieved.

The structures, methods, and the like described in this embodiment can be combined as appropriate with any of the structures, methods, and the like described in other embodiments.

Embodiment 10

In this embodiment, a structure of a semiconductor device which functions as a memory device will be described as a specific embodiment of a semiconductor device according to an embodiment of the invention disclosed herein. Note that a semiconductor device including a transistor in which a first multi-component oxide semiconductor layer including single crystal regions, a single-component oxide semiconductor layer including single crystal regions, and a second multi-component oxide semiconductor layer including single crystal regions (hereinafter referred to as an oxide semiconductor stack) are used and a transistor in which a material other than an oxide semiconductor stack (e.g., silicon) is used is described here.

Figure 19:
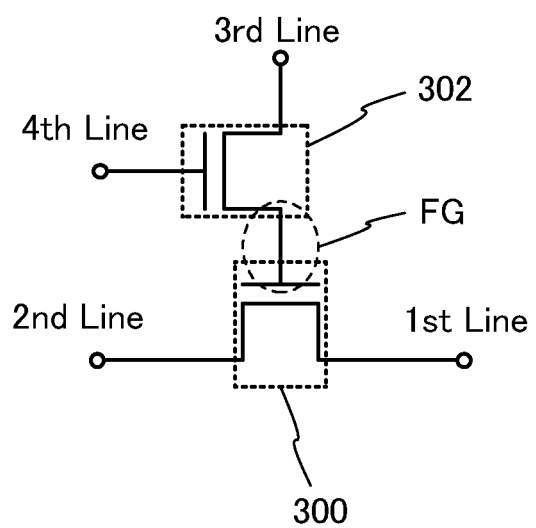
FIG. 19 is an equivalent circuit diagram illustrating a semiconductor device according to an embodiment of the present invention.

In a semiconductor device illustrated in FIG. 19, a gate electrode of a transistor 300 and one of a source electrode and a drain electrode of a transistor 302 are electrically connected to each other. In addition, a first wiring (a first line, also referred to as a source line) is electrically connected to a source electrode of the transistor 300. A second wiring (a second line, also referred to as a bit line) is electrically connected to a drain electrode of the transistor 300. A third wiring (a third line, also referred to as a first signal line) is electrically connected to the other of the source electrode and the drain electrode of the transistor 302. A fourth wiring (a fourth line, also referred to as a second signal line) is electrically connected to a gate electrode of the transistor 302. Here, a material other than an oxide semiconductor stack (e.g., silicon) is used for the transistor 300, and an oxide semiconductor stack is used for the transistor 302. In FIG. 19, the transistor 302 is denoted by "OS tr".

The transistor 300 formed using a material other than an oxide semiconductor stack can operate at sufficiently high speed. Therefore, with the use of the transistor 300, high-speed reading of stored contents and the like are possible. Moreover, the transistor 302 formed using an oxide semiconductor stack has extremely small off-state current. For that reason, a potential of the gate electrode of the transistor 300 can be held for an extremely long time by turning off the transistor 302.

When the source electrode or the drain electrode of the transistor 302 is electrically connected to the gate electrode of the transistor 300, an effect similar to that of a floating gate of a floating gate transistor used for a nonvolatile memory element can be achieved. Therefore, in this embodiment, a portion where the source electrode or the drain electrode of the transistor 302 is electrically connected to the gate electrode of the transistor 300 is called a floating gate portion FG. The floating gate portion FG can be regarded as being provided in an insulator (a so-called floating state) and thus electric charge is held in the floating gate portion FG The off-state current of the transistor 302 is about 100,000 times lower than that of the transistor 300 formed using a silicon semiconductor, so that loss of electric charge stored in the floating gate portion FG due to leakage of the transistor 302 can be ignored.

Employing such a structure can avoid deterioration of a gate insulating layer (a tunnel insulating layer) due to tunneling current which flows when electrons are injected into a floating gate, which has been a problem of a conventional floating gate transistor. For that reason, a limitation on the number of writings can be theoretically ignored in the semiconductor device illustrated in FIG. 19.

Note that a capacitor may be added to the floating gate portion FG. Addition of a capacitor to the floating gate portion FG facilitates holding of electric charge and suppressing of a potential change of the floating gate portion FG due to a potential change of each wiring.

In the semiconductor device illustrated in FIG. 19, writing, holding, and reading of data can be performed in the following manner, using the advantage that the potential of the gate electrode of the transistor 300 can be held.

First, writing and holding of data will be described. First, a potential of the fourth wiring is set to a potential at which the transistor 302 is turned on, and the transistor 302 is turned on. Therefore, a potential of the third wiring is applied to the gate electrode of the transistor 300 (writing). After that, the potential of the fourth wiring is set to a potential at which the transistor 302 is turned off, and the transistor 302 is turned off, whereby the potential of the gate electrode of the transistor 300 is held (holding).

Since the off-state current of the transistor 302 is extremely small, the potential of the gate electrode of the transistor 300 is held for a long time. For example, when the potential of the gate electrode of the transistor 300 is a potential at which the transistor 300 is turned on, the on state of the transistor 300 is kept for a long time. Moreover, when the potential of the gate electrode of the transistor 300 is a potential at which the transistor 300 is turned off, the off state of the transistor 300 is kept for a long time.

Next, reading of data will be described. When a predetermined potential (a fixed potential) is supplied to the first wiring in a state where the on state or the off state of the transistor 300 is kept as described above, a potential of the second wiring varies depending on the on state or the off state of the transistor 300.

In this manner, by comparing the potential of the first wiring with the potential of the second wiring in a state where data is held, the data can be read out.

Then, rewriting of data will be described. Rewriting of data is performed in a manner similar to that of the writing and holding of data. That is, a potential of the fourth wiring is set to a potential at which the transistor 302 is turned on, and the transistor 302 is turned on. Accordingly, the potential of the third wiring (a potential relating to new data) is applied to the gate electrode of the transistor 300. After that, the potential of the fourth wiring is set to a potential at which the transistor 302 is turned off, and the transistor 302 is turned off; accordingly, the new data is held.

In the semiconductor device according to the invention disclosed herein, data can be directly rewritten by another writing of data as described above. For that reason, erasing operation which is necessary for a flash memory or the like is not needed, so that a reduction in operation speed due to erasing operation can be suppressed. In other words, high-speed operation of the semiconductor device can be realized.

In addition, the semiconductor device according to this embodiment can hold data for an extremely long time because the transistor 302 has small off-state current. That is, refresh operation which is necessary in a DRAM and the like is not needed, so that power consumption can be suppressed. Moreover, the semiconductor device can be used as a substantially non-volatile semiconductor device.

Since writing or the like of data is performed with switching operation of the transistor 302, high voltage is not necessary and deterioration of the element does not become a problem. Furthermore, data is written and erased depending on the on state or the off state of the transistor, whereby high-speed operation can be easily realized.

Since a transistor including a material other than an oxide semiconductor can operate at sufficiently high speed, by using such a transistor, stored data can be read out at high speed.

Although an n-channel transistor in which electrons are carriers is used in the above description, it is needless to say that a p-channel transistor in which holes are carriers can be used instead of the n-channel transistor.

The semiconductor device according to this embodiment can be formed, for example, using the stacked structure of the transistors described in the above embodiment. It is needless to say that the stacked structure of the transistors is not necessarily limited to the structure of the transistors described in the above embodiment. For example, the transistor 300 and the transistor 302 may be formed on the same surface. Further, since the semiconductor device according to this embodiment utilizes low off-state current of the transistor 302, there is no particular limitation on the transistor 300. For example, the transistor 300 is formed using a material other than an oxide semiconductor in this embodiment; however, an oxide semiconductor may be used.

In this embodiment, the semiconductor device which is a minimum unit is described; however, the structure of the semiconductor device is not limited thereto. A more advanced semiconductor device can be formed by connecting a plurality of semiconductor devices as appropriate. For example, a NAND-type or NOR-type semiconductor device serving as a memory device can be formed by using a plurality of the above-described semiconductor devices. The structure of the wirings is not limited to that illustrated in FIG. 19 and can be changed as appropriate.

The structures, methods, and the like described in this embodiment can be combined as appropriate with any of the structures, methods, and the like described in other embodiments.

Embodiment 11

In this embodiment, a transistor including an oxide semiconductor stack that is c-axis-aligned perpendicularly to the surface is manufactured, and by using the transistor for a pixel portion, and further for a driver circuit, a semiconductor device having a display function (also referred to as a display device) is manufactured. Furthermore, when part or whole of a driver circuit is formed over the same substrate as a pixel portion, a system-on-panel can be formed.

Figure 20A:
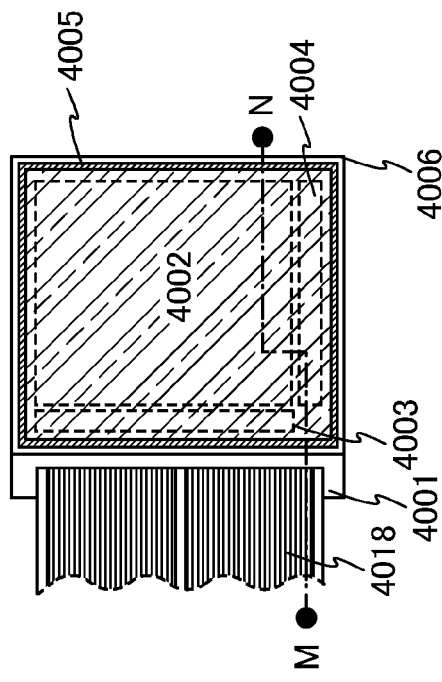
FIGS. 20A and 20B are a top view and a cross-sectional view illustrating a semiconductor device according to an embodiment of the present invention.
Figure 20B:
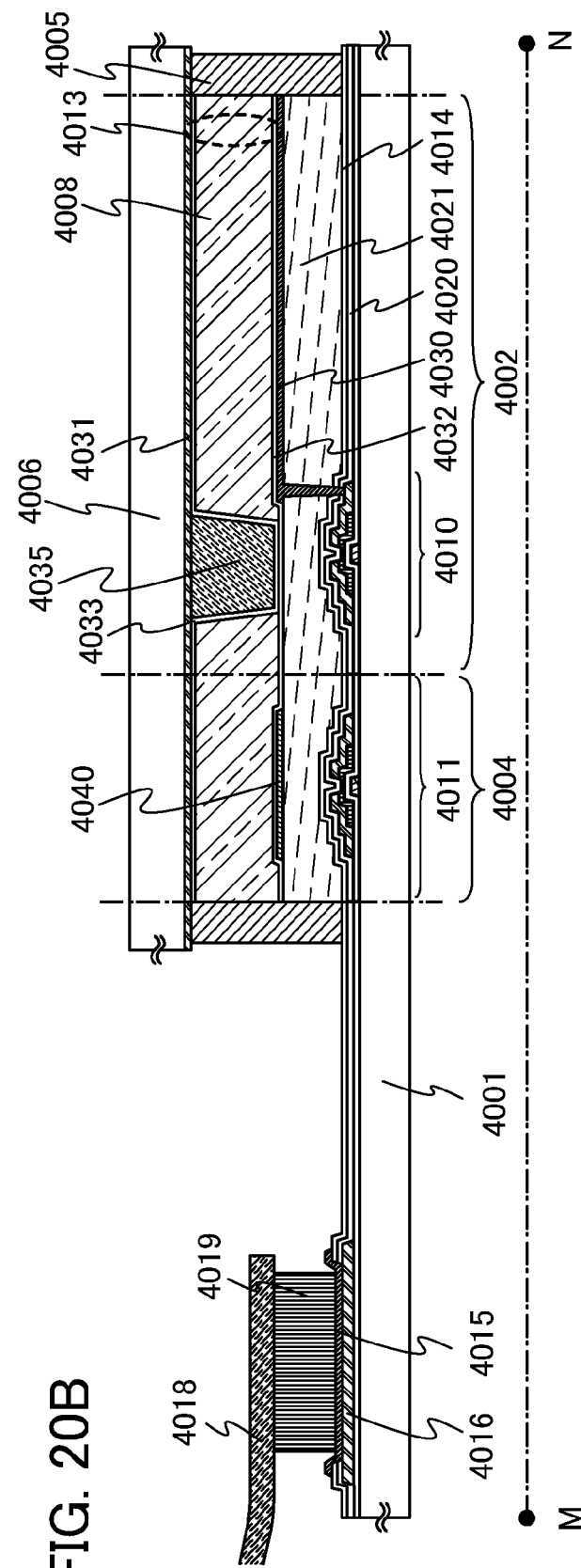

In this embodiment, a liquid crystal display device is described as a semiconductor device which is one mode of the present invention. First, the appearance and the cross section of a liquid crystal display panel, which is one mode of the semiconductor device, will be described with reference to FIGS. 20A and 20B. FIG. 20A is a top view of a panel in which transistors 4010 and 4011 each including an oxide semiconductor stack which is c-axis aligned perpendicularly to the surface, and a liquid crystal element 4013 are sealed between a first substrate 4001 and a second substrate 4006 with a sealant 4005. FIG. 20B is a cross-sectional view along line M-N of FIG. 20A.

The sealant 4005 is formed to surround a pixel portion 4002, a signal line driver circuit 4003, and a scan line driver circuit 4004 that are provided over the first substrate 4001. The second substrate 4006 is provided over the pixel portion 4002, the signal line driver circuit 4003, and the scan line driver circuit 4004. Thus, the pixel portion 4002, the signal line driver circuit 4003, and the scan line driver circuit 4004 are sealed together with a liquid crystal layer 4008 by the first substrate 4001, the sealant 4005, and the second substrate 4006.

The pixel portion 4002, the signal line driver circuit 4003, and the scan line driver circuit 4004 provided over the first substrate 4001 each include a plurality of transistors. FIG. 20B illustrates the transistor 4010 included in the pixel portion 4002 and the transistor 4011 included in the scan line driver circuit 4004. Insulating layers 4014, 4020, and 4021 are provided over the transistors 4010 and 4011.

The transistor including the oxide semiconductor stack which is c-axis aligned perpendicularly to the surface and described in Embodiment 6 can be used as the transistors 4010 and 4011. In this embodiment, the transistors 4010 and 4011 are n-channel transistors.

A conductive layer 4040 is provided over part of the insulating layer 4021, which overlaps with a channel formation region of the oxide semiconductor stack which is c-axis aligned perpendicularly to the surface of the transistor 4011 for the driver circuit. The conductive layer 4040 is provided so as to overlap with the channel formation region of the oxide semiconductor stack which is c-axis aligned perpendicularly to the surface, whereby, as one effect, the conductive layer 4040 functions as a passivation layer and can prevent entry of hydrogen into the channel formation region from the outside, and thus, the amount of change in threshold voltage of the transistor 4011 before and after the BT test can be reduced. A potential of the conductive layer 4040 may be the same as or different from that of a gate electrode of the transistor 4011. The conductive layer 4040 can also function as a second gate electrode. Further, the potential of the conductive layer 4040 may be GND or 0 V, or the conductive layer 4040 may be in a floating state.

A pixel electrode 4030 included in the liquid crystal element 4013 is electrically connected to the transistor 4010. A counter electrode 4031 of the liquid crystal element 4013 is formed on the second substrate 4006. The liquid crystal element 4013 corresponds to a region where the pixel electrode 4030, the counter electrode 4031, and the liquid crystal layer 4008 overlap with each other. Note that the pixel electrode 4030 and the counter electrode 4031 are provided with an insulating layer 4032 and an insulating layer 4033 serving as alignment films, respectively, and the liquid crystal layer 4008 is sandwiched between the pixel electrode 4030 and the counter electrode 4031 with the insulating layers 4032 and 4033 interposed therebetween.

As the liquid crystal layer 4008, a liquid crystal such as a thermotropic liquid crystal, a low-molecular liquid crystal, a high-molecular liquid crystal, a polymer-dispersed liquid crystal, a ferroelectric liquid crystal, or an anti-ferroelectric liquid crystal is used. Such a liquid crystal material exhibits a cholesteric phase, a smectic phase, a cubic phase, a chiral nematic phase, an isotropic phase, or the like depending on conditions.

Note that glass or plastics can be used as the second substrate 4006.

A columnar spacer 4035 which can be obtained by selectively etching an insulating layer is provided to control a distance (a cell gap) between the pixel electrode 4030 and the counter electrode 4031. Alternatively, a spherical spacer may be used. The counter electrode 4031 is electrically connected to a common potential line provided over the same insulating substrate as the transistor 4010. In addition, with the use of a common connection portion, the counter electrode 4031 and the common potential line can be electrically connected to each other by conductive particles arranged between the pair of substrates. Note that the conductive particles are included in the sealant 4005.

Alternatively, a liquid crystal exhibiting a blue phase for which an alignment film is unnecessary may be used. A blue phase is one of liquid crystal phases, which is generated just before a cholesteric phase changes into an isotropic phase while temperature of a cholesteric liquid crystal is increased. Since the blue phase is only generated within a narrow range of temperature, a liquid crystal composition including a chiral agent at higher than or equal to 5 wt % is preferably used for the liquid crystal layer 4008 in order to improve the temperature range. The liquid crystal composition which includes a liquid crystal exhibiting a blue phase and a chiral agent has a short response time of lower than or equal to 1 msec, has optical isotropy, which makes the alignment process unneeded, and has a small viewing angle dependence.

When a liquid crystal exhibiting a blue phase is used, rubbing treatment on an alignment film is unnecessary; accordingly, electrostatic discharge damage caused by the rubbing treatment can be prevented and defects and damage of the liquid crystal display device in the manufacturing process can be reduced. Thus, productivity of the liquid crystal display device can be increased. A transistor including an oxide semiconductor stack particularly has a possibility that electric characteristics of the transistor may fluctuate significantly by the influence of static electricity and deviate from the designed range. Therefore, it is more effective to use a blue phase liquid crystal material for a liquid crystal display device including a transistor that includes an oxide semiconductor stack.

Although a transmissive liquid crystal display device is described in this embodiment, an embodiment of the present invention can also be applied to a reflective liquid crystal display device or a transflective liquid crystal display device.

In this embodiment, a structure of the liquid crystal display device is described in which a polarizing plate is provided on the outer surface of the substrate (on the viewer side) and a coloring layer and an electrode used for a display element are provided on the inner surface of the substrate in this order; however, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process. Furthermore, a light-blocking layer serving as a black matrix may be provided as needed.

In this embodiment, in order to reduce surface unevenness of the transistors and to improve reliability of the transistors, the transistors are covered with a protective layer or an insulating layer which functions as a planarizing insulating layer (the insulating layer 4020, the insulating layer 4014, and the insulating layer 4021). Note that the protective layer is provided to prevent entry of a contaminant impurity such as an organic substance, a metal substance, or water vapor contained in the air and is preferably a dense film. The protective layer may be formed with a single layer or a stacked layer using one or more of a silicon oxide layer, a silicon nitride layer, a silicon oxynitride layer, a silicon nitride oxide layer, an aluminum oxide layer, an aluminum nitride layer, an aluminum oxynitride layer, and an aluminum nitride oxide layer by a sputtering method.

Here, a stack of insulating layers is formed as the protective layer. As the insulating layer 4020 that is a first layer, a silicon oxide layer is formed by a sputtering method. When a silicon oxide layer is used as a protective layer, oxygen is added to the oxide semiconductor layer that is in contact with the protective layer, so that oxygen defects can be reduced.

The insulating layer 4014 is formed as a second layer of the protective layer. Here, as the second layer that is the insulating layer 4014, a silicon nitride layer which is one of nitride insulating layers is formed by a plasma CVD method, and then heat treatment is performed. The use of the silicon nitride layer as the protective layer can prevent ions such as sodium ions from entering a semiconductor region, thereby suppressing variations in electric characteristics of the transistor.

The insulating layer 4021 is formed as a planarizing insulating layer. The insulating layer 4021 can be formed using an organic material such as acrylic. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating layers formed of these materials.

The pixel electrode 4030 and the counter electrode 4031 can be formed of a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Further, a variety of signals and potentials are supplied to the signal line driver circuit 4003, the scan line driver circuit 4004, and the pixel portion 4002 which are formed over one substrate from an FPC 4018.

In this embodiment, a connection terminal electrode 4015 is formed using the same conductive layer as the pixel electrode 4030 included in the liquid crystal element 4013. A terminal electrode 4016 is formed using the same conductive layer as source and drain electrodes included in the transistors 4010 and 4011.

The connection terminal electrode 4015 is electrically connected to a terminal included in the FPC 4018 through an anisotropic conductive layer 4019.

In addition, if needed, a color filter is provided in each of the pixels. In addition, a polarization plate and a diffusing plate are provided on the outer sides of the first substrate 4001 and the second substrate 4006. Further, a light source of a backlight is formed using a cold-cathode tube or an LED. Thus, a liquid crystal display module is obtained.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti Ferroelectric Liquid Crystal) mode, or the like.

Through the above process, a liquid crystal display device can be manufactured. Although FIGS. 20A and 20B illustrate a transmissive liquid crystal display device, the present invention is applicable to a transflective liquid crystal display device or a reflective liquid crystal display device.

The transistor including the oxide semiconductor stack that is c-axis-aligned perpendicularly to the surface and described in Embodiment 6 has high field-effect mobility; therefore, when a liquid crystal display device is manufactured using the transistor as described in this embodiment, a liquid crystal display device having excellent display characteristics is realized. Furthermore, in this embodiment, when a still image is displayed, by operating the driver circuit portion so as to stop the output of a signal to be supplied to a signal line or a scan line, power consumption of the driver circuit portion as well as the pixel portion can be reduced.

This embodiment can be implemented in appropriate combination with the any of the structures described in other embodiments.

Embodiment 12

Figure 21A:
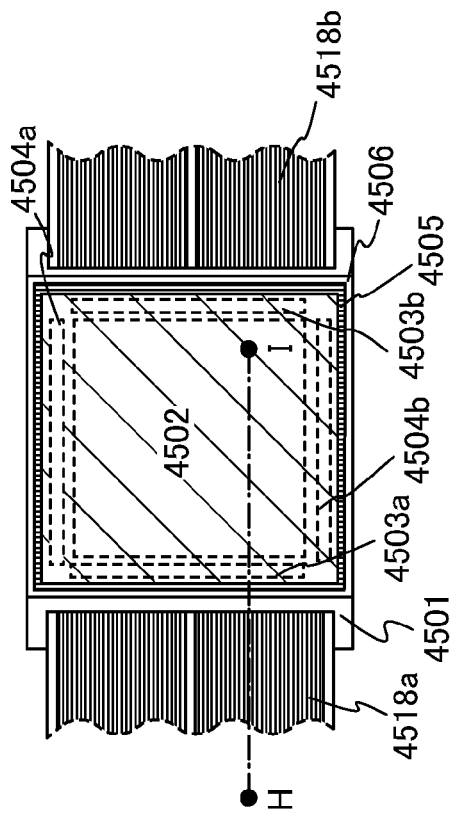
FIGS. 21A and 21B are a top view and a cross-sectional view illustrating a semiconductor device according to an embodiment of the present invention.
Figure 21B:
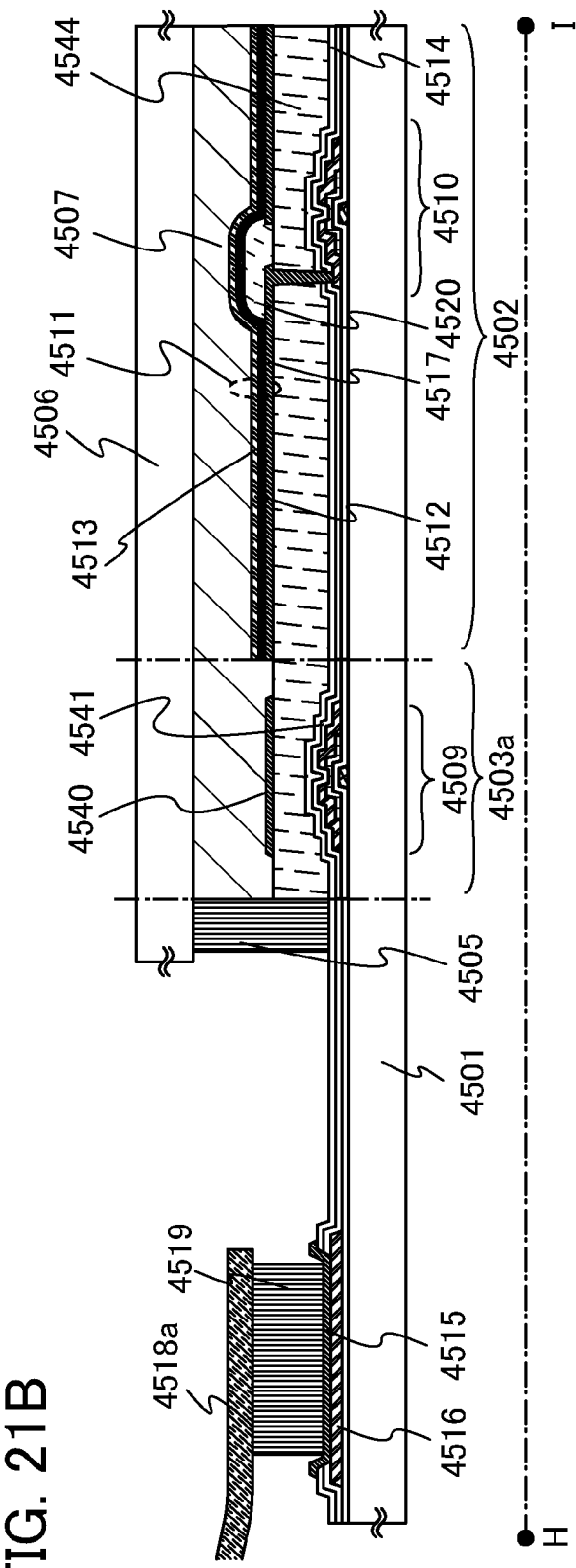

The appearance and the cross section of a light-emitting display panel (also referred to as a light-emitting panel) which corresponds to one mode of a semiconductor device will be described with reference to FIGS. 21A and 21B. FIG. 21A is a top view of a panel in which a transistor including an oxide semiconductor stack that is c-axis aligned perpendicularly to the surface and an electroluminescence element (also referred to as an EL element) formed over a first substrate are sealed between the first substrate and a second substrate with a sealant. FIG. 21B is a cross-sectional view taken along line H-I of FIG. 21A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. In this manner, it is preferable that the light-emitting display panel be packaged (sealed) with a protective film or a cover material with high air-tightness and little degasification so as not to be exposed to the external air.

The pixel portion 4502, the signal line driver circuits 4503*a* and 4503*b*, and the scan line driver circuits 4504*a* and 4504*b* formed over the first substrate 4501 each include a plurality of transistors, and a transistor 4510 included in the pixel portion 4502 and a transistor 4509 included in the signal line driver circuit 4503*a* are illustrated as an example in FIG. 21B.

For the transistors 4509 and 4510, the transistor which has high mobility, includes the oxide semiconductor stack that is c-axis aligned perpendicularly to the surface, and is described in Embodiment 6 can be employed. In this embodiment, the transistors 4509 and 4510 are n-channel transistors.

Over an insulating layer 4544, a conductive layer 4540 is provided so as to overlap with a channel formation region of an oxide semiconductor stack in the transistor 4509 used for a driver circuit. A potential of the conductive layer 4540 may be the same as or different from that of a gate electrode of the transistor 4509. The conductive layer 4540 can also serve as a second gate electrode. The potential of the conductive layer 4540 may be GND or 0 V, or the conductive layer 4540 may be in a floating state.

In the transistor 4509, as a protective insulating layer, an insulating layer 4541 is formed in contact with an oxide semiconductor stack including a channel formation region. The insulating layer 4541 can be formed using a material and a method which are similar to those of the oxide insulating layer 412 described in Embodiment 6. A protective insulating layer 4514 is formed over the insulating layer 4541. The protective insulating layer 4514 can be formed using a material and a method which are similar to those of the insulating layer 416 described in Embodiment 6. Here, a silicon nitride layer is formed by a PCVD method as the protective insulating layer 4514.

In order to reduce the surface roughness of the transistors, the insulating layer 4544 functioning as a planarizing insulating layer is formed over the protective insulating layer 4514. The insulating layer 4544 may be formed using a material and a method which are similar to those of the insulating layer 4021 described in Embodiment 11. Here, acrylic is used for the insulating layer 4544.

A first electrode 4517 that is a pixel electrode of a light-emitting element 4511 is electrically connected to a source electrode or a drain electrode of the transistor 4510. Note that the light-emitting element 4511 has a stacked structure of the first electrode 4517, an EL layer 4512, and a second electrode 4513, but there is no particular limitation on the structure. The structure of the light-emitting element 4511 can be changed as appropriate depending on the direction in which light is extracted from the light-emitting element 4511, or the like.

A partition wall 4520 is formed using an organic resin layer or an inorganic insulating layer. It is particularly preferable that the partition wall 4520 be formed using a photosensitive material and an opening be formed over the first electrode 4517 so that a sidewall of the opening is formed as an inclined surface with continuous curvature.

The EL layer 4512 may be formed using a single layer or by stacking a plurality of layers.

A protective layer may be formed over the second electrode 4513 and the partition wall 4520 in order to prevent oxygen, hydrogen, moisture, carbon dioxide, or the like from entering the light-emitting element 4511. As the protective layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive layer as the first electrode 4517 included in the light-emitting element 4511, and a terminal electrode 4516 is formed using the same conductive layer as the source and drain electrodes included in the transistors 4509 and 4510.

The connection terminal electrode 4515 is electrically connected to a terminal included in the FPC 4518a through an anisotropic conductive layer 4519.

As the second substrate 4506 located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon, and acrylic, an epoxy resin, or the like can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element.

Through the above process, a light-emitting display device (display panel) can be manufactured.

The transistor including the oxide semiconductor stack that is c-axis-aligned perpendicularly to the surface and described in Embodiment 6 has high field-effect mobility; therefore, when a light-emitting display device is manufactured using the transistor as described in this embodiment, a light-emitting display device having excellent display characteristics is realized. Furthermore, in this embodiment, when a still image is displayed, by operating the driver circuit portion so as to stop the output of a signal to be supplied to a signal line or a scan line, power consumption of the driver circuit portion as well as the pixel portion can be reduced.

This embodiment can be implemented in appropriate combination with any of the structures described in other embodiments.

Embodiment 13

In this embodiment, an electronic paper will be described as a mode of a semiconductor device.

The transistor including the oxide semiconductor stack that is c-axis-aligned perpendicularly to the surface and obtained by the method described in Embodiment 6 may be used for an electronic paper in which electronic ink is driven by an element electrically connected to a switching element. The electronic paper is also referred to as an electrophoretic display device (electrophoretic display) and has advantages in that it has the same level of readability as plain paper, it has lower power consumption than other display devices, and it can be made thin and lightweight.

There are a variety of modes of electrophoretic displays. For example, the electrophoretic display can have a structure in which a plurality of microcapsules each including first particles having positive electric charge and second particles having negative electric charge are dispersed in a solvent or a solute, and an electrical field is applied to the microcapsules so that the particles in the microcapsules move in opposite directions from each other, and only a color of the particles gathered on one side is displayed. Note that the first particles and the second particles each contain pigment and do not move without an electric field. Moreover, the first particles and the second particles have different colors (which may be colorless) from each other.

Thus, an electrophoretic display is a display that utilizes a so-called dielectrophoretic effect by which a substance having a high dielectric constant moves to a high-electric field region.

A solution in which the aforementioned microcapsules are dispersed throughout a solvent is referred to as electronic ink. This electronic ink can be printed on a surface of glass, plastic, cloth, paper, or the like. Furthermore, by using a color filter or particles that have a pigment, color display can be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, an active matrix substrate which is formed using the transistor including the oxide semiconductor stack that is c-axis-aligned perpendicularly to the surface and described in Embodiment 6 can be used.

Note that the first particles and the second particles in the microcapsules can each be formed using a single material selected from a conductor material, an insulator material, a semiconductor material, a magnetic material, a liquid crystal material, a ferroelectric material, an electroluminescent material, an electrochromic material, and a magnetophoretic material, or formed using a composite material including any of these.

Figure 22:
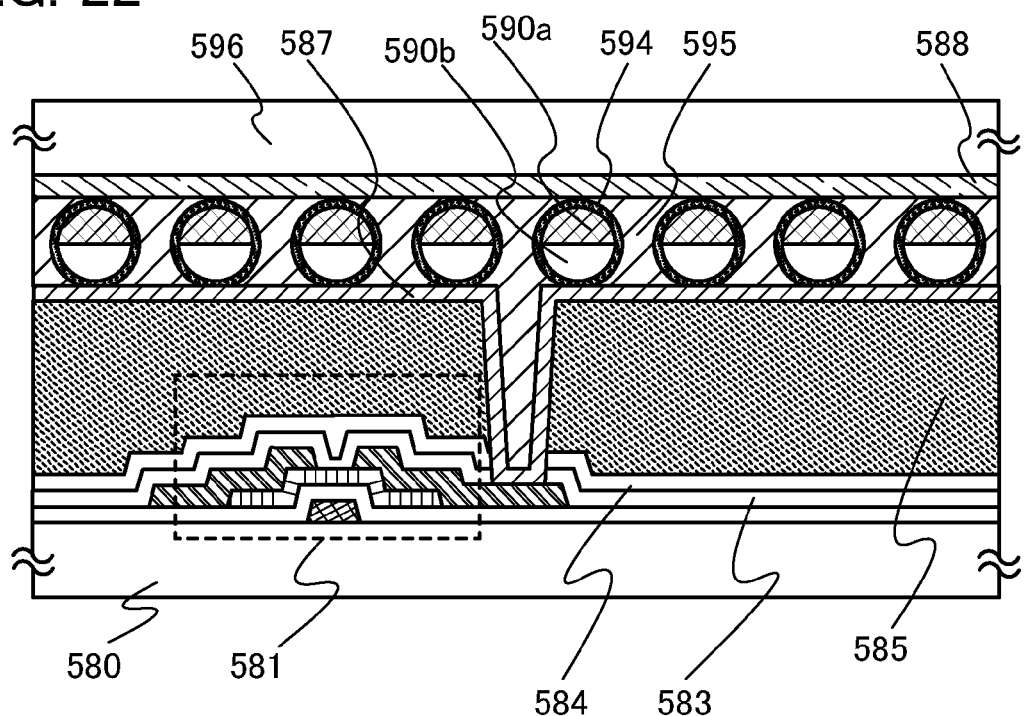
FIG. 22 is a cross-sectional view illustrating a semiconductor device according to an embodiment of the present invention.

FIG. 22 illustrates an active matrix electronic paper as an embodiment of a semiconductor device. A transistor 581 used for the semiconductor device can be manufactured in a manner similar to that of the transistor described in Embodiment 6 and is a transistor with high mobility which includes an oxide semiconductor stack that is c-axis-aligned perpendicularly to the surface. In addition, an insulating layer 584 is a nitride insulating layer.

The electronic paper illustrated in FIG. 22 is an embodiment of a display device using a twisting ball display system. In the twisting ball display system, spherical particles each colored in black and white are arranged between a first electrode and a second electrode which are electrodes used for a display element, and a potential difference is generated between the first electrode and the second electrode to control orientation of the spherical particles, so that display is performed.

The transistor 581 which is formed over a first substrate 580 is a transistor having a bottom-gate structure and is covered with an insulating layer 583 that is in contact with a semiconductor layer. A source or drain electrode of the transistor 581 is electrically connected to a first electrode 587 through an opening formed in insulating layers 583, 584, and 585. A cavity 594 exists between the first electrode 587 and a second electrode 588. The cavity 594 is filled with liquid and a spherical particle having a black region 590*a* and a white region 590*b*. A space around the cavity 594 is filled with a filler 595 such as a resin (see FIG. 22).

In addition, the first electrode 587 corresponds to a pixel electrode, and the second electrode 588 corresponds to a common electrode. The second electrode 588 which is provided on a second substrate 596 is electrically connected to a common potential line provided over the same insulating substrate as the transistor 581. By using a common connection portion, the second electrode 588 and the common potential line can be electrically connected to each other through conductive particles arranged between the pair of substrates.

Further, instead of the twisting ball, an electrophoretic element can be used. A microcapsule having a diameter of about 10 μm to 200 μm in which transparent liquid, positively charged white microparticles, and negatively charged black microparticles are encapsulated, is used. In the microcapsule provided between a first electrode and a second electrode, when an electric field is applied by the first electrode and the second electrode, the white microparticles and the black microparticles move in opposite directions to each other, so that white or black can be displayed. A display element using this principle is an electrophoretic display element, and is referred to as an electronic paper in general. Instead of the black microparticles, microparticles of any of R, G, and B (R means red; G, green; and B, blue) may be used, so that color display can be performed.

Through the above steps, the electronic paper can be manufactured.

In this embodiment, a so-called electronic paper is manufactured with the use of the transistor including the oxide semiconductor stack that is c-axis-aligned perpendicularly to the surface and described in Embodiment 6. Since the transistor has high field-effect mobility, when the electronic paper is manufactured using the transistor, the electronic paper can have excellent display characteristics.

This embodiment can be implemented in appropriate combination with any of the structures described in other embodiments.

Embodiment 14

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

In this embodiment, embodiments of an electronic device on which the display device obtained in any of Embodiments 11 to 13 is mounted are described with reference to FIGS. 23A to 23E and FIG. 24.

Figure 23A:
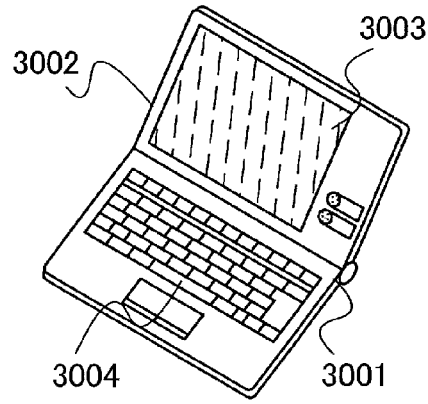
FIGS. 23A to 23E are diagrams each illustrating an embodiment of an electronic device.

FIG. 23A illustrates a laptop personal computer which is manufactured by mounting at least a display device as a component and which includes a main body 3001, a housing 3002, a display portion 3003, a keyboard 3004, and the like. Note that this laptop personal computer includes the liquid crystal display device described in Embodiment 11.

Figure 23D:
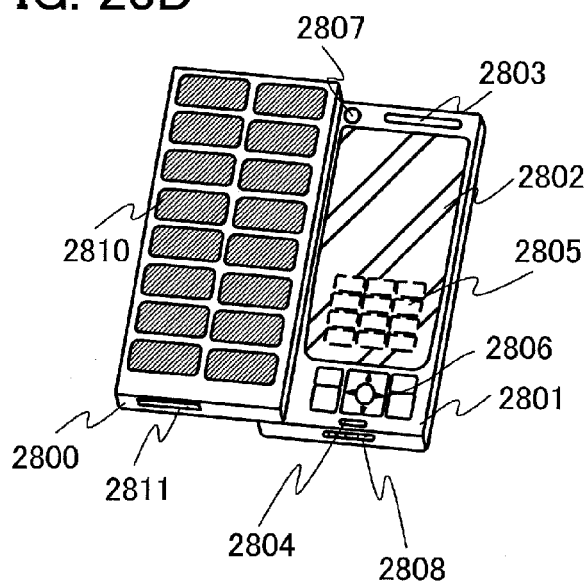
Figure 23B:
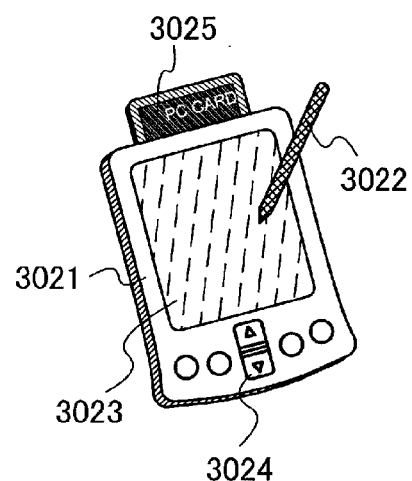

FIG. 23B illustrates a portable information terminal (which is also referred to as a personal digital assistant (PDA)) which is manufactured by mounting at least a display device as a component. A main body 3021 is provided with a display portion 3023, an outside interface 3025, an operation button 3024, and the like. In addition, the portable information terminal has a stylus 3022 as an accessory for operation. Note that this portable information terminal includes the light-emitting display device described in Embodiment 12.

Figure 23E:
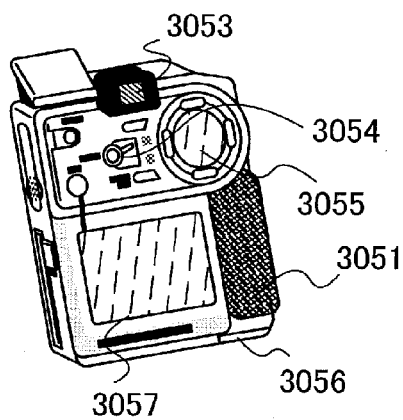
Figure 23C:
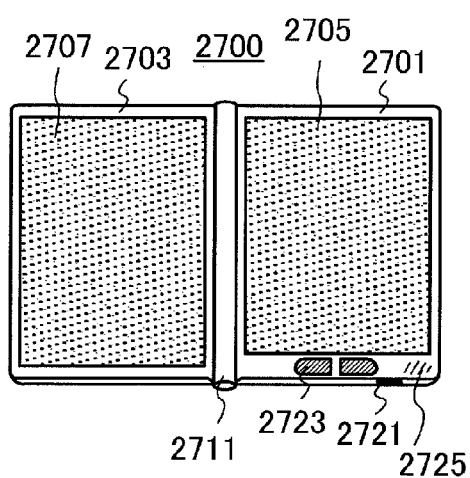

FIG. 23C illustrates an e-book reader manufactured by mounting the electronic paper described in Embodiment 13 as a component. FIG. 23C illustrates an embodiment of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on the display portion 2705 and the display portion 2707, for example, the right display portion (the display portion 2705 in FIG. 23C) can display text and the left display portion (the display portion 2707 in FIG. 23C) can display images.

FIG. 23C illustrates an embodiment in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

FIG. 23D illustrates a mobile phone which is manufactured by mounting at least a display device as a component and which includes two housings, a housing 2800 and a housing 2801. The housing 2801 is provided with a display panel 2802, a speaker 2803, a microphone 2804, a pointing device 2806, a camera lens 2807, an external connection terminal 2808, and the like. The housing 2800 is provided with a solar cell 2810 for charging of the mobile phone, an external memory slot 2811, and the like. Further, an antenna is incorporated in the housing 2801.

Further, the display panel 2802 is provided with a touch panel. A plurality of operation keys 2805 which are displayed as images are illustrated by dashed lines in FIG. 23D. Note that a boosting circuit by which a voltage output from the solar cell 2810 is increased to be a voltage necessary for each circuit is also included.

In the display panel 2802, the direction of display is changed appropriately depending on an application mode. Further, the mobile phone is provided with the camera lens 2807 on the same surface as the display panel 2802, and thus it can be used as a video phone. The speaker 2803 and the microphone 2804 can be used for videophone, recording, playback, and the like without being limited to voice calls. Further, the housings 2800 and 2801 in a state where they are developed as illustrated in FIG. 23D can shift by sliding to a state where one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a large amount of data can be stored and moved by inserting a storage medium into the external memory slot 2811.

Further, in addition to the above functions, an infrared communication function, a television reception function, or the like may be provided.

FIG. 23E illustrates a digital camera which is manufactured by mounting at least a display device as a component and which includes a main body 3051, a display portion (A) 3057, an eyepiece portion 3053, an operation switch 3054, a display portion (B) 3055, a battery 3056, and the like.

Figure 24:
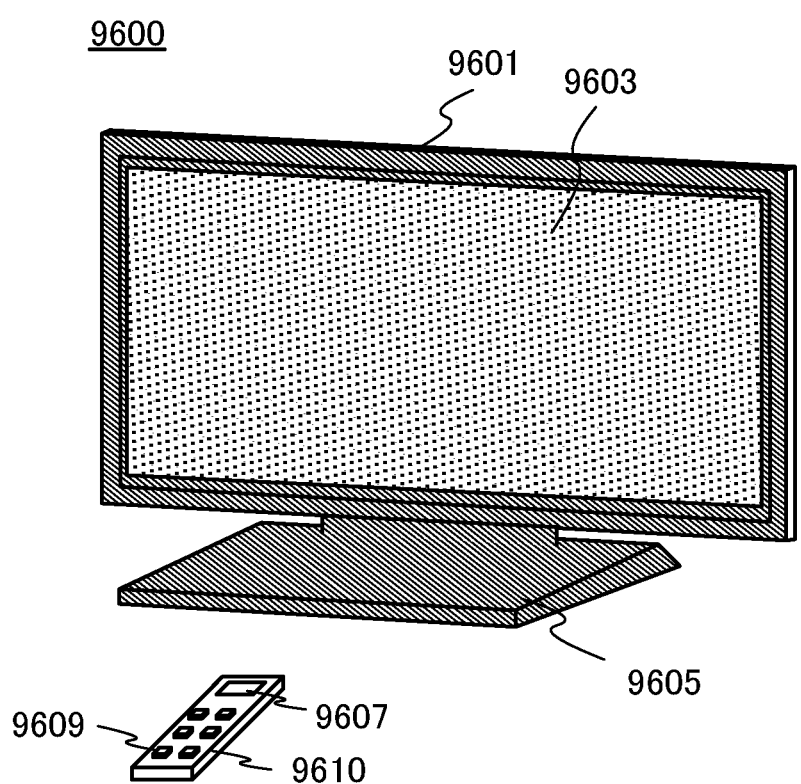
FIG. 24 is a diagram illustrating an embodiment of an electronic device.

FIG. 24 illustrates an embodiment of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) data communication can be performed.

In the display portion 9603, a plurality of the transistors described in Embodiment 6 are provided as switching elements of pixels. As a driver circuit formed over the same insulating substrate as the display portion 9603, the transistor with high mobility, which is described in Embodiment 6, is provided.

This embodiment can be freely combined with any of Embodiments 1 to 13.

This application is based on Japanese Patent Application serial no. 2009-296825 filed with Japan Patent Office on Dec. 28, 2009, the entire contents of which are hereby incorporated by reference.

EXPLANATION OF REFERENCE

100: substrate, 101: insulating layer, 102: multi-component oxide semiconductor layer, 103: multi-component oxide semiconductor layer, 104: single-component oxide semiconductor layer, 105: single-component oxide semiconductor layer, 106: multi-component oxide semiconductor layer, 107: multi-component oxide semiconductor layer, 108: conductive layer, 109: layer, 110: oxide semiconductor stack, 112: gate insulating layer, 114: gate electrode, 116: insulating layer, 118: interlayer insulating layer, 150: transistor, 152: transistor, 160: crystal nuclei, 162: arrow, 174: arrow, 176: arrow, 200: substrate, 206: element isolation insulating layer, 214: impurity region, 216: channel formation region, 218: sidewall insulating layer, 220: high-concentration impurity region, 224: metal compound region, 226: interlayer insulating layer, 228: interlayer insulating layer, 234: insulating layer, 250: transistor, 256: insulating layer, 300: transistor, 302: transistor, 400: gate electrode, 401: gate insulating layer, 402: gate insulating layer, 403: multi-component oxide semiconductor layer, 405: single-component oxide semiconductor layer, 407: multi-component oxide semiconductor layer, 412: oxide insulating layer, 414: back gate electrode, 416: insulating layer, 418: interlayer insulating layer, 420: oxide insulating layer, 450: transistor, 451: transistor, 452: transistor, 581: transistor, 583: insulating layer, 584: insulating layer, 587: electrode, 588: electrode, 594: cavity: 595: filler, 103*a*: multi-component oxide semiconductor layer, 103*b*: multi-component oxide semiconductor layer, 105*a*: single-component oxide semiconductor layer, 105*b*: single-component oxide semiconductor layer, 106*a*: multi-component oxide semiconductor layer, 107*a*: multi-component oxide semiconductor layer, 108*a*: wiring, 108*b*: wiring, 164*a*: arrow, 208*a*: gate insulating layer, 210*a*: gate electrode, 230*a*: wiring, 230*b*: wiring, 230*c*: wiring, 236*a*: wiring, 236*b*: wiring, 236*c*: wiring, 254*a*: wiring, 254*b*: wiring, 254*c*: wiring, 254*d*: wiring, 254*e*: wiring, 258*a*: wiring, 258*b*: wiring, 258*c*: wiring, 258*d*: wiring, 2700: e-book reader, 2701: housing, 2703: housing, 2705: display portion, 2707: display portion, 2711: shaft, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3023: display portion, 3024: operation button, 3025: outside interface, 3051: main body, 3053: eyepiece portion, 3054: operation switch, 3055: display portion (B), 3056: battery, 3057: display portion (A), 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4014: insulating layer, 4015: connection terminal electrode, 4016: terminal electrode, 4018: FPC, 4019: anisotropic conductive layer, 4020: insulating layer, 4021: insulating layer, 4030: pixel electrode, 4031: counter electrode, 4032: insulating layer, 4033: insulating layer, 4035: spacer, 403*a*:

multi-component oxide semiconductor layer, 403*b*: multi-component oxide semiconductor layer, 4040: conductive layer, 405*a*: single-component oxide semiconductor layer, 405*b*: single-component oxide semiconductor layer, 407*a*: multi-component oxide semiconductor layer, 407*b*: multi-component oxide semiconductor layer, 408*a*: wiring, 408*b*: wiring, 4501: substrate, 4502: pixel portion, 4505: sealant, 4506: substrate, 4507: filler, 4509: transistor, 4510: transistor, 4511: light-emitting element, 4512: EL layer, 4513: electrode, 4514: protective insulating layer, 4515: connection terminal electrode, 4516: terminal electrode, 4517: electrode, 4519: anisotropic conductive layer, 4520: partition wall, 4540: conductive layer, 4541: insulating layer, 4544: insulating layer, 590*a*: black region, 590*b*: white region, 9600: television set, 9601: housing, 9603: display portion, 9605: stand, 9607: display portion, 9609; operation key, 9610: remote controller, 4503*a*: signal line driver circuit, 4503*b*: signal line driver circuit, 4504*a*: scan line driver circuit, 4504*b*: scan line drier circuit, 4518*a*: FPC, 4518*b*: FPC

What is claimed is:

1. A semiconductor device comprising:
a substrate; and
a transistor over the substrate, the transistor comprising:
   a gate electrode;
   an oxide semiconductor layer including a channel; and
   a gate insulating film interposed between the gate electrode and the oxide semiconductor layer,
wherein the oxide semiconductor layer includes:
   a first oxide semiconductor layer including a first crystalline region;
   a second oxide semiconductor layer including a second crystalline region, the second oxide semiconductor layer being over the first oxide semiconductor layer; and
   a third oxide semiconductor layer including a third crystalline region, the third oxide semiconductor layer being over the second oxide semiconductor layer,
wherein the second crystalline region includes a first crystal,
wherein the third crystalline region includes a second crystal, and
wherein each of a c-axis of the first crystal and a c-axis of the second crystal is aligned substantially perpendicular to a surface of the substrate.

2. The semiconductor device according to claim 1,
wherein the gate electrode is located over or below the oxide semiconductor layer.

3. The semiconductor device according to claim 2, further comprising a first transistor below the transistor,
wherein a first channel of the first transistor includes silicon.

4. The semiconductor device according to claim 1,
wherein the transistor further comprises an oxide insulating layer over and in contact with the oxide semiconductor layer.

5. The semiconductor device according to claim 1,
wherein each of the first oxide semiconductor layer, the second oxide semiconductor layer, and the third oxide semiconductor layer includes a zinc, and
wherein a component ratio of zinc in the first oxide semiconductor layer is different from a component ratio of zinc in the second oxide semiconductor layer.

6. The semiconductor device according to claim 1,
wherein the second oxide semiconductor layer is formed of zinc oxide.

7. The semiconductor device according to claim 1,
wherein each of the first oxide semiconductor layer and the third oxide semiconductor layer includes at least one of indium, gallium, tin, aluminum, magnesium, and zinc.

8. The semiconductor device according to claim 1,
wherein a thickness of the second oxide semiconductor layer is thinner than that of the third oxide semiconductor layer.

9. The semiconductor device according to claim 1,
wherein the first crystalline region includes a third crystal whose c-axis is aligned substantially perpendicular to the surface of the substrate.

10. The semiconductor device according to claim 9,
wherein at least one of the first crystalline region, the second crystalline region, and the third crystalline region comprises a single crystalline region.

11. A semiconductor device comprising:
a substrate; and
a transistor over the substrate, the transistor comprising:
   a gate electrode;
   an oxide semiconductor layer including a channel; and
   a gate insulating film interposed between the gate electrode and the oxide semiconductor layer,
wherein the oxide semiconductor layer includes:
   a first oxide semiconductor layer including a first crystalline region;
   a second oxide semiconductor layer including a second crystalline region, the second oxide semiconductor layer being over the first oxide semiconductor layer; and
   a third oxide semiconductor layer including a third crystalline region, the third oxide semiconductor layer being over the second oxide semiconductor layer,
wherein the second crystalline region includes a first crystal,
wherein the third crystalline region includes a second crystal,
wherein each of a c-axis of the first crystal and a c-axis of the second crystal is aligned substantially perpendicular to a surface of the substrate, and
wherein a component of the first oxide semiconductor layer is different from a component of the second oxide semiconductor layer.

12. The semiconductor device according to claim 11,
wherein the gate electrode is located over or below the oxide semiconductor layer.

13. The semiconductor device according to claim 12, further comprising a first transistor below the transistor,
wherein a first channel of the first transistor includes silicon.

14. The semiconductor device according to claim 11,
wherein the transistor further comprises an oxide insulating layer over and in contact with the oxide semiconductor layer.

15. The semiconductor device according to claim 11,
wherein each of the first oxide semiconductor layer, the second oxide semiconductor layer, and the third oxide semiconductor layer includes a zinc, and
wherein a component ratio of zinc in the first oxide semiconductor layer is different from a component ratio of zinc in the second oxide semiconductor layer.

16. The semiconductor device according to claim 11,
wherein the second oxide semiconductor layer is formed of zinc oxide.

17. The semiconductor device according to claim 11, wherein each of the first oxide semiconductor layer and the third oxide semiconductor layer includes at least one of indium, gallium, tin, aluminum, magnesium, and zinc.

18. The semiconductor device according to claim 11, wherein a thickness of the second oxide semiconductor layer is thinner than that of the third oxide semiconductor layer.

19. The semiconductor device according to claim 11, wherein the first crystalline region includes a third crystal whose c-axis is aligned substantially perpendicular to the surface of the substrate.

20. The semiconductor device according to claim 19, wherein at least one of the first crystalline region, the second crystalline region, and the third crystalline region comprises a single crystalline region.

21. A semiconductor device comprising:
a substrate; and
a transistor over the substrate, the transistor comprising:
 a first gate electrode;
 a gate insulating film over the first gate electrode;
 an oxide semiconductor layer including a channel over the gate insulating film; and
 a second gate electrode over the oxide semiconductor layer,
wherein the oxide semiconductor layer includes:
 a first oxide semiconductor layer including a first crystalline region;
 a second oxide semiconductor layer including a second crystalline region, the second oxide semiconductor layer being over the first oxide semiconductor layer; and
 a third oxide semiconductor layer including a third crystalline region, the third oxide semiconductor layer being over the second oxide semiconductor layer,
wherein the second crystalline region includes a first crystal,
wherein the third crystalline region includes a second crystal, and
wherein each of a c-axis of the first crystal and a c-axis of the second crystal is aligned substantially perpendicular to a surface of the substrate.

22. The semiconductor device according to claim 21, wherein the second oxide semiconductor layer is formed of zinc oxide.

23. The semiconductor device according to claim 21, wherein the first crystalline region includes a third crystal whose c-axis is aligned substantially perpendicular to the surface of the substrate.

24. The semiconductor device according to claim 23, wherein at least one of the first crystalline region, the second crystalline region, and the third crystalline region comprises a single crystalline region.

25. A semiconductor device comprising:
a substrate; and
a transistor over the substrate, the transistor comprising:
 a first gate electrode;
 a gate insulating film over the first gate electrode;
 an oxide semiconductor layer including a channel over the gate insulating film; and
 a second gate electrode over the oxide semiconductor layer,
wherein the oxide semiconductor layer includes:
 a first oxide semiconductor layer including a first crystalline region;
 a second oxide semiconductor layer including a second crystalline region, the second oxide semiconductor layer being over the first oxide semiconductor layer; and
 a third oxide semiconductor layer including a third crystalline region, the third oxide semiconductor layer being over the second oxide semiconductor layer,
wherein the second crystalline region includes a first crystal,
wherein the third crystalline region includes a second crystal,
wherein each of a c-axis of the first crystal and a c-axis of the second crystal is aligned substantially perpendicular to a surface of the substrate, and
wherein a component of the first oxide semiconductor layer is different from a component of the second oxide semiconductor layer.

26. The semiconductor device according to claim 25, wherein the second oxide semiconductor layer is formed of zinc oxide.

27. The semiconductor device according to claim 25, wherein the first crystalline region includes a third crystal whose c-axis is aligned substantially perpendicular to the surface of the substrate.

28. The semiconductor device according to claim 27, wherein at least one of the first crystalline region, the second crystalline region, and the third crystalline region comprises a single crystalline region.

29. A semiconductor device comprising:
a substrate; and
a transistor over the substrate, the transistor comprising:
 a gate electrode;
 a first oxide semiconductor layer;
 a second oxide semiconductor layer over the first oxide semiconductor layer, the second oxide semiconductor layer comprising a crystalline region; and
 a third oxide semiconductor layer over the second oxide semiconductor layer, and
 a gate insulating film between the gate electrode and the first oxide semiconductor layer,
wherein the crystalline region comprises a crystal structure in which a c-axis is substantially perpendicular to a surface of the substrate.

30. The semiconductor device according to claim 29, further comprising an electrode,
wherein the electrode is in direct contact with a side surface of the second oxide semiconductor layer.

31. The semiconductor device according to claim 29, further comprising a first transistor below the transistor,
wherein a channel of the first transistor comprises silicon.

32. The semiconductor device according to claim 31, further comprising an aluminum oxide layer over and in contact with the transistor.

33. The semiconductor device according to claim 29,
wherein each of the first oxide semiconductor layer, the second oxide semiconductor layer, and the third oxide semiconductor layer comprises zinc, and
wherein a component ratio of zinc in the first oxide semiconductor layer is different from a component ratio of zinc in the second oxide semiconductor layer.

34. The semiconductor device according to claim 29,
wherein each of the first oxide semiconductor layer and the third oxide semiconductor layer comprises at least one of indium, gallium, tin, aluminum, magnesium, and zinc.

35. A semiconductor device comprising:
a substrate; and
a transistor over the substrate, the transistor comprising:
- a gate electrode;
- a first oxide semiconductor layer;
- a second oxide semiconductor layer over the first oxide semiconductor layer, the second oxide semiconductor layer comprising a crystalline region; and
- a third oxide semiconductor layer over the second oxide semiconductor layer, and
- a gate insulating film between the gate electrode and the first oxide semiconductor layer, wherein the crystalline region comprises a crystal structure in which a c-axis is substantially perpendicular to a surface of the second oxide semiconductor layer.

36. The semiconductor device according to claim 35, further comprising an electrode,
wherein the electrode is in direct contact with a side surface of the second oxide semiconductor layer.

37. The semiconductor device according to claim 35, further comprising a first transistor below the transistor,
wherein a channel of the first transistor comprises silicon.

38. The semiconductor device according to claim 37, further comprising an aluminum oxide layer over and in contact with the transistor.

39. The semiconductor device according to claim 35,
wherein each of the first oxide semiconductor layer, the second oxide semiconductor layer, and the third oxide semiconductor layer comprises zinc, and
wherein a component ratio of zinc in the first oxide semiconductor layer is different from a component ratio of zinc in the second oxide semiconductor layer.

40. The semiconductor device according to claim 35,
wherein each of the first oxide semiconductor layer and the third oxide semiconductor layer comprises at least one of indium, gallium, tin, aluminum, magnesium, and zinc.

* * * * *

UNITED STATES PATENT AND TRADEMARK OFFICE
CERTIFICATE OF CORRECTION

PATENT NO.         : 8,686,425 B2
APPLICATION NO.    : 13/584840
DATED              : April 1, 2014
INVENTOR(S)        : Yamazaki et al.

Page 1 of 1

It is certified that error appears in the above-identified patent and that said Letters Patent is hereby corrected as shown below:

In the Specification

Column 10, line 20, "(ZnO)," should be --$(ZnO)_m$--;

Column 18, line 54, "ink jet" should be --ink-jet--;

Column 18, line 55, "ink jet" should be --ink-jet--.

Signed and Sealed this
Twenty-ninth Day of July, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,686,425 B2 | Page 1 of 1 |
| APPLICATION NO. | : 13/584840 | |
| DATED | : April 1, 2014 | |
| INVENTOR(S) | : Yamazaki et al. | |

It is certified that error appears in the above-identified patent and that said Letters Patent is hereby corrected as shown below:

In the Specification

Column 4, line 51, first occurrence, "$cm^3$" should be --$cm^{-3}$--;

Column 4, line 51, second occurrence, "$cm^3$" should be --$cm^{-3}$--;

Column 4, line 52, "$cm^3$" should be --$cm^{-3}$--.

Signed and Sealed this
Thirtieth Day of September, 2014

Michelle K. Lee
*Deputy Director of the United States Patent and Trademark Office*